(12) United States Patent
Taylor et al.

(10) Patent No.: US 12,022,671 B2
(45) Date of Patent: Jun. 25, 2024

(54) LIGHT-EMITTING STRUCTURE WITH PATTERNED BANK

(71) Applicant: SHARP KABUSHIKI KAISHA, Sakai (JP)

(72) Inventors: Peter Neil Taylor, Oxford (GB); Valerie Berryman-Bousquet, Chipping Norton (GB); Hywel Hopkin, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 170 days.

(21) Appl. No.: 17/410,226

(22) Filed: Aug. 24, 2021

(65) Prior Publication Data
US 2023/0064348 A1   Mar. 2, 2023

(51) Int. Cl.
| | | |
|---|---|---|
| *H10K 50/115* | (2023.01) | |
| *H10K 59/122* | (2023.01) | |
| *H10K 59/35* | (2023.01) | |
| *H10K 71/00* | (2023.01) | |
| *H10K 59/12* | (2023.01) | |

(52) U.S. Cl.
CPC ......... *H10K 50/115* (2023.02); *H10K 59/122* (2023.02); *H10K 59/353* (2023.02); *H10K 71/00* (2023.02); *H10K 59/1201* (2023.02)

(58) Field of Classification Search
CPC .. H10K 50/115; H10K 59/353; H10K 59/122; H10K 71/00
USPC .......................................................... 257/40
See application file for complete search history.

(56) References Cited

U.S. PATENT DOCUMENTS

| | | | |
|---|---|---|---|
| 2010/0045173 A1* | 2/2010 | Kwon | H10K 59/12 313/504 |
| 2014/0183479 A1* | 7/2014 | Park | H10K 59/1315 438/34 |
| 2020/0243625 A1* | 7/2020 | Beak | H10K 59/1213 |
| 2022/0077201 A1* | 3/2022 | Lee | H01L 33/62 |
| 2022/0077430 A1* | 3/2022 | Choi | H10K 59/38 |
| 2022/0165952 A1* | 5/2022 | Mei | H10K 50/125 |

FOREIGN PATENT DOCUMENTS

JP   2019102337 A   6/2019

OTHER PUBLICATIONS

Lee et al., "Three-dimensional pixel configurations for optical outcoupling of OLED displays—optical simulation" Proceedings SID Display Week 2019, published 2019.
Unpublished U.S. co-pending U.S. Appl. No. 16/908,659.
Unpublished U.S. co-pending U.S. Appl. No. 17/245,373.

* cited by examiner

*Primary Examiner* — Xia L Cross
(74) *Attorney, Agent, or Firm* — ScienBiziP, P.C.

(57) ABSTRACT

A light-emitting structure comprises a substrate, a sub-pixel stack patterned over the substrate, an insulating material patterned to surround the emissive stack, and a bank patterned to surround the sub-pixel stack and the insulating material. The sub-pixel stack comprises an emissive stack between a first electrode layer and a second electrode layer.

8 Claims, 17 Drawing Sheets

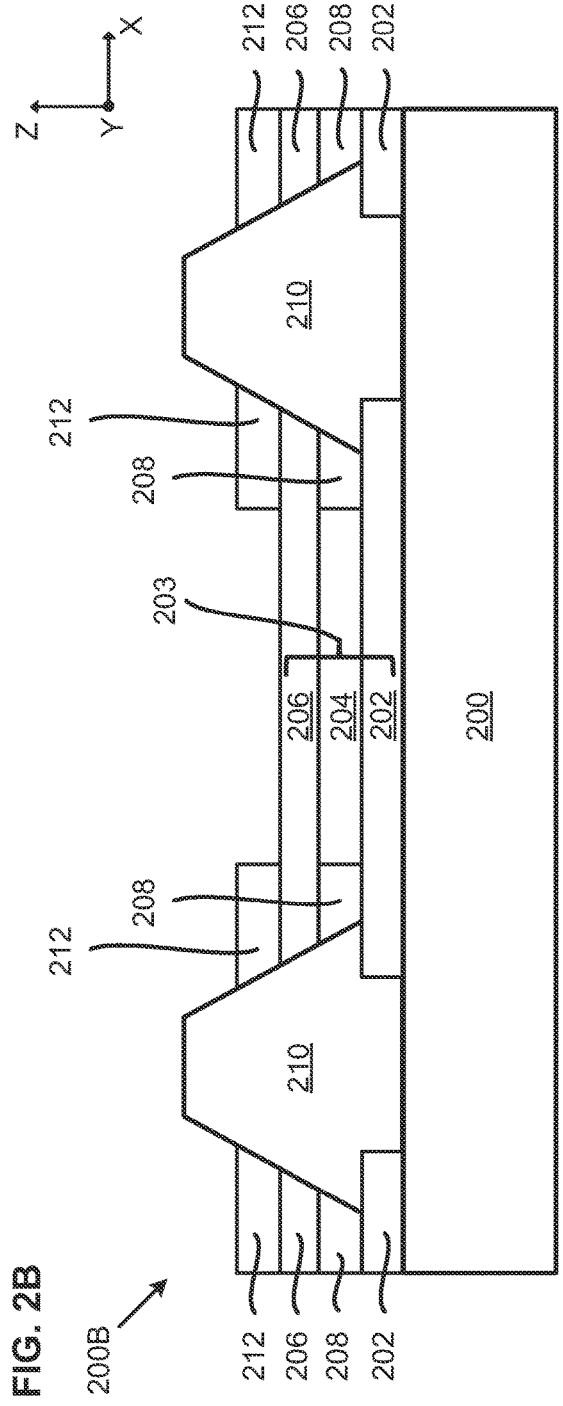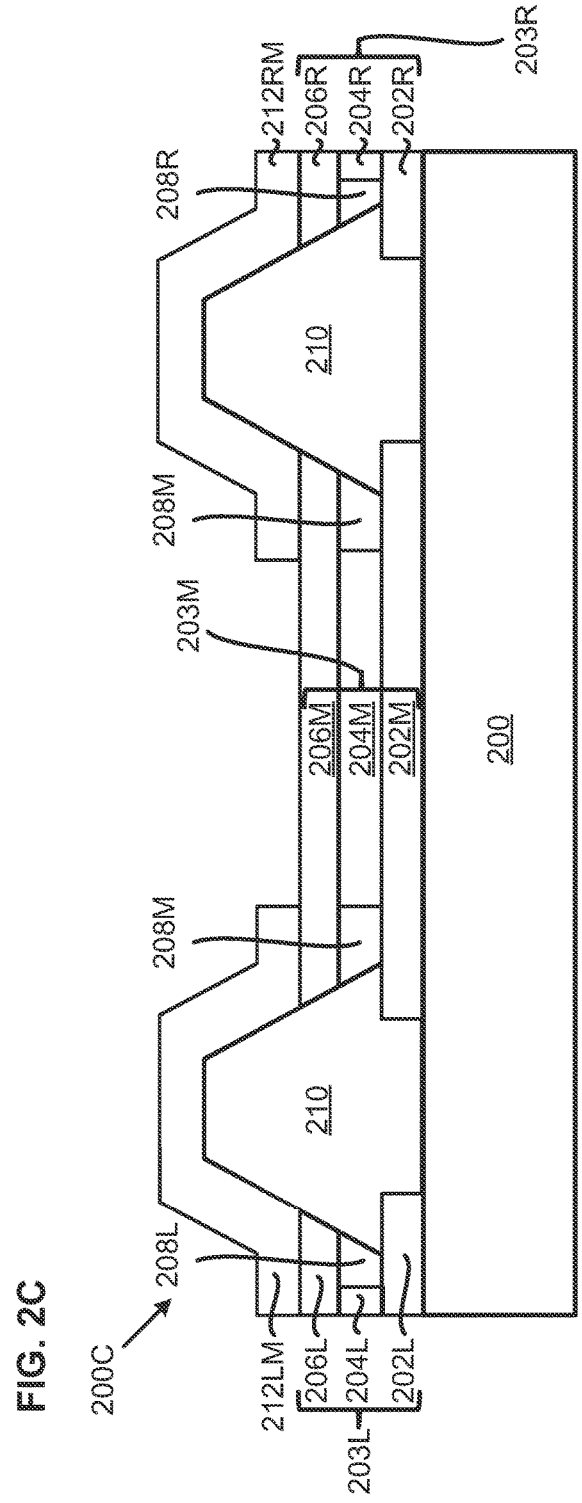

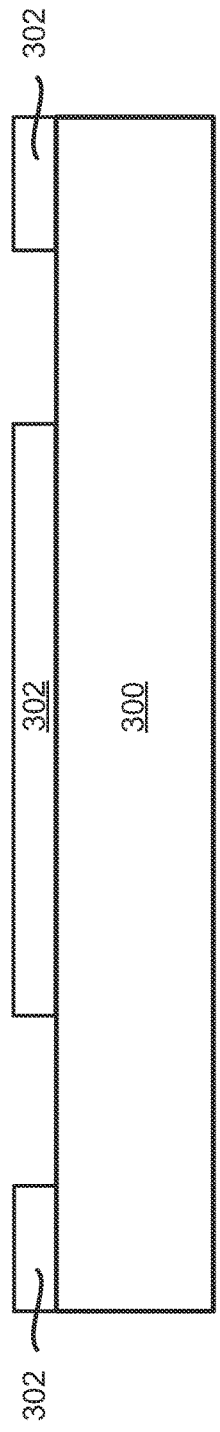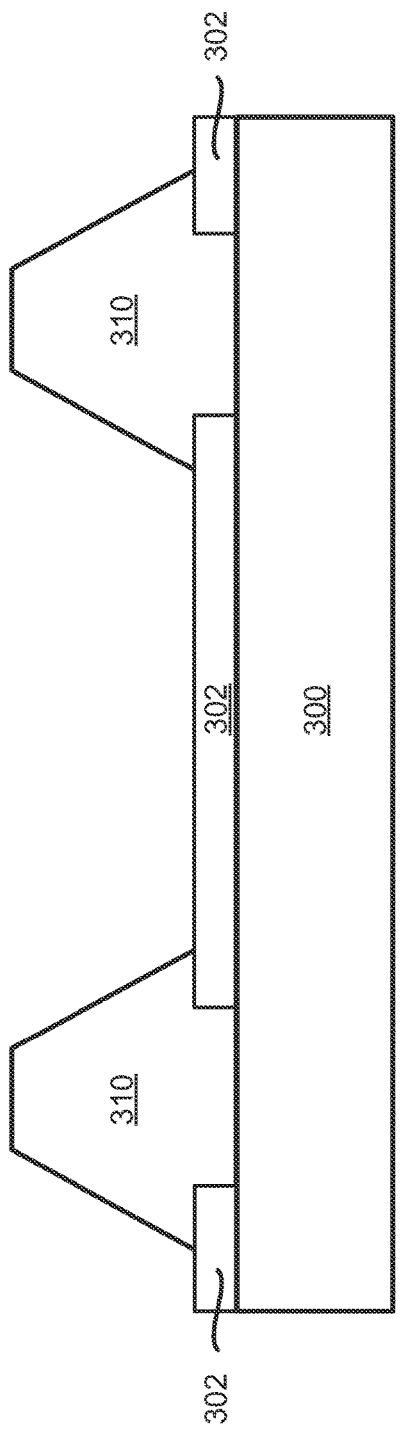

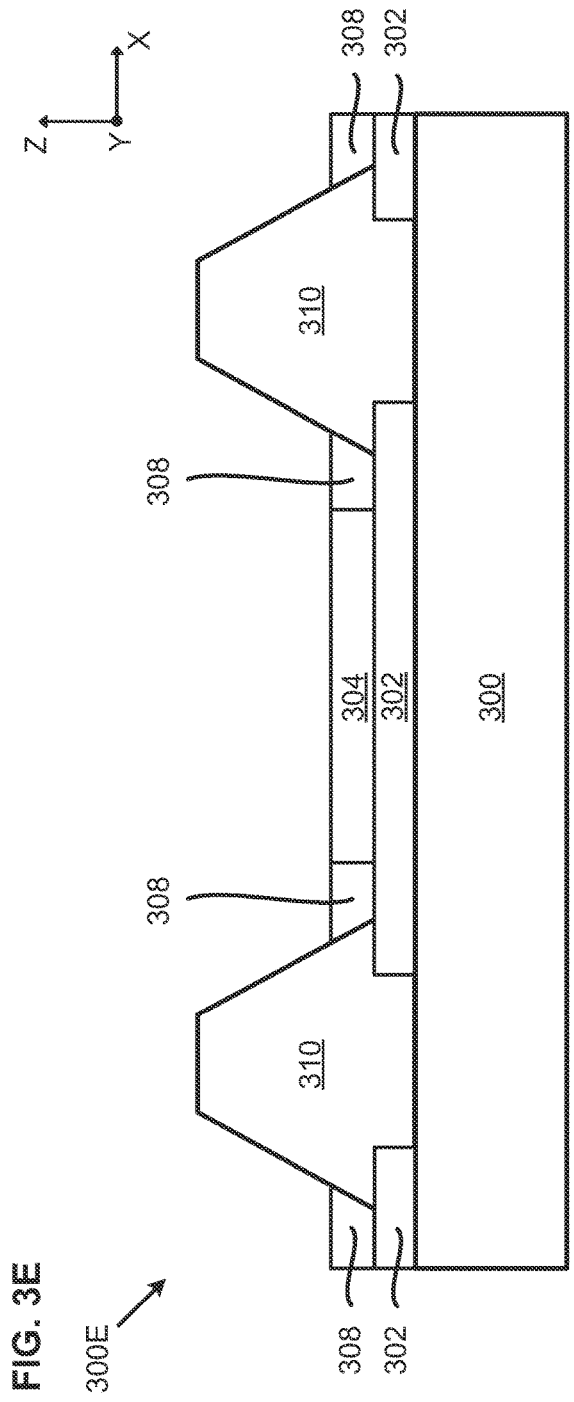
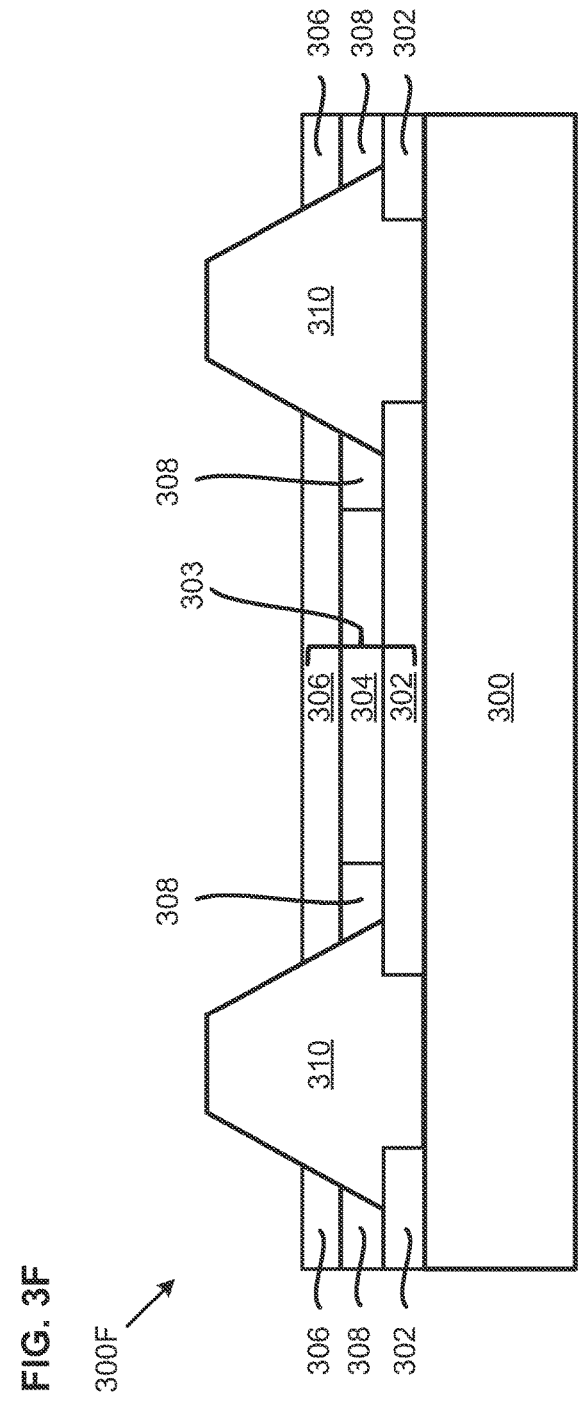

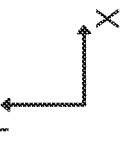
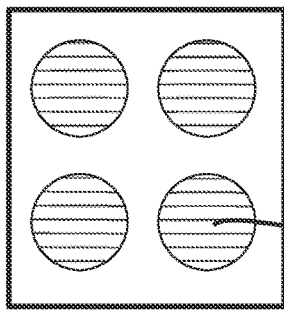
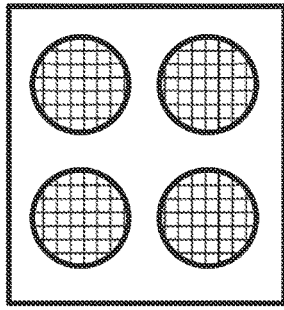
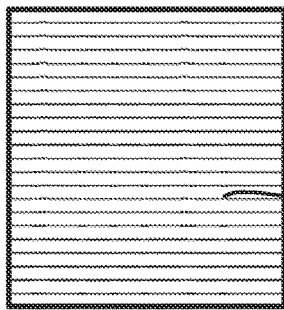
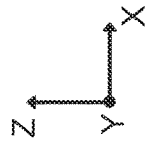
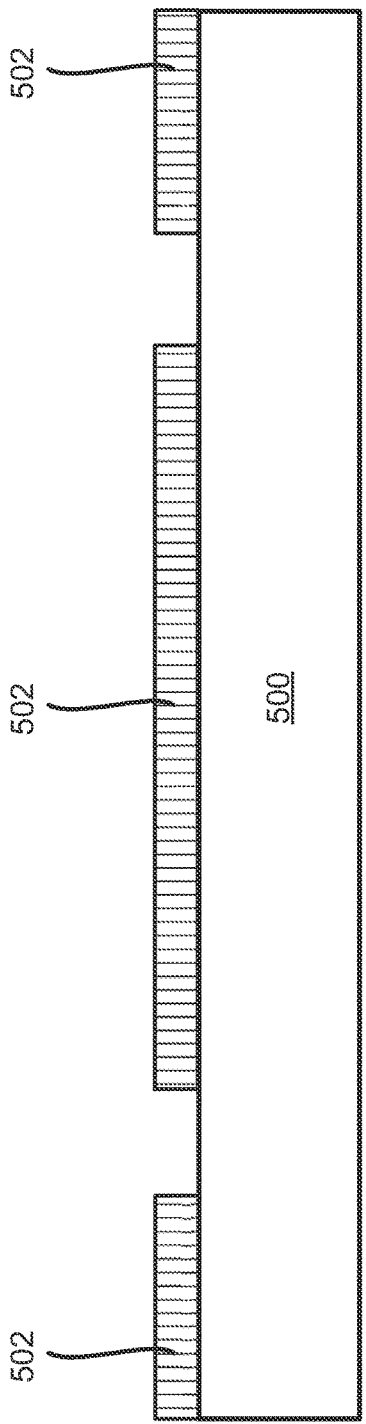

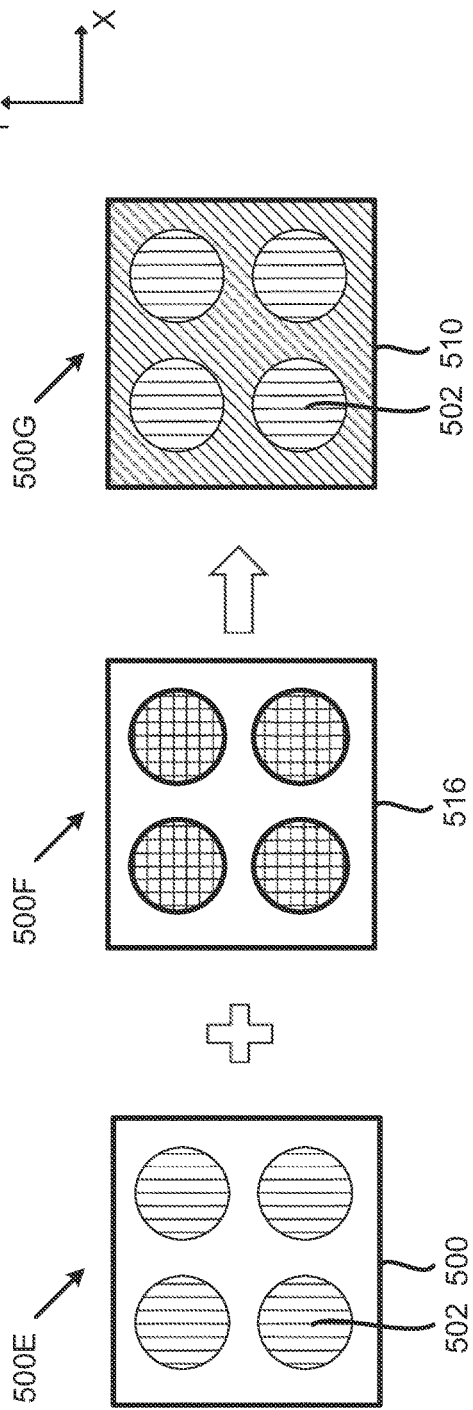
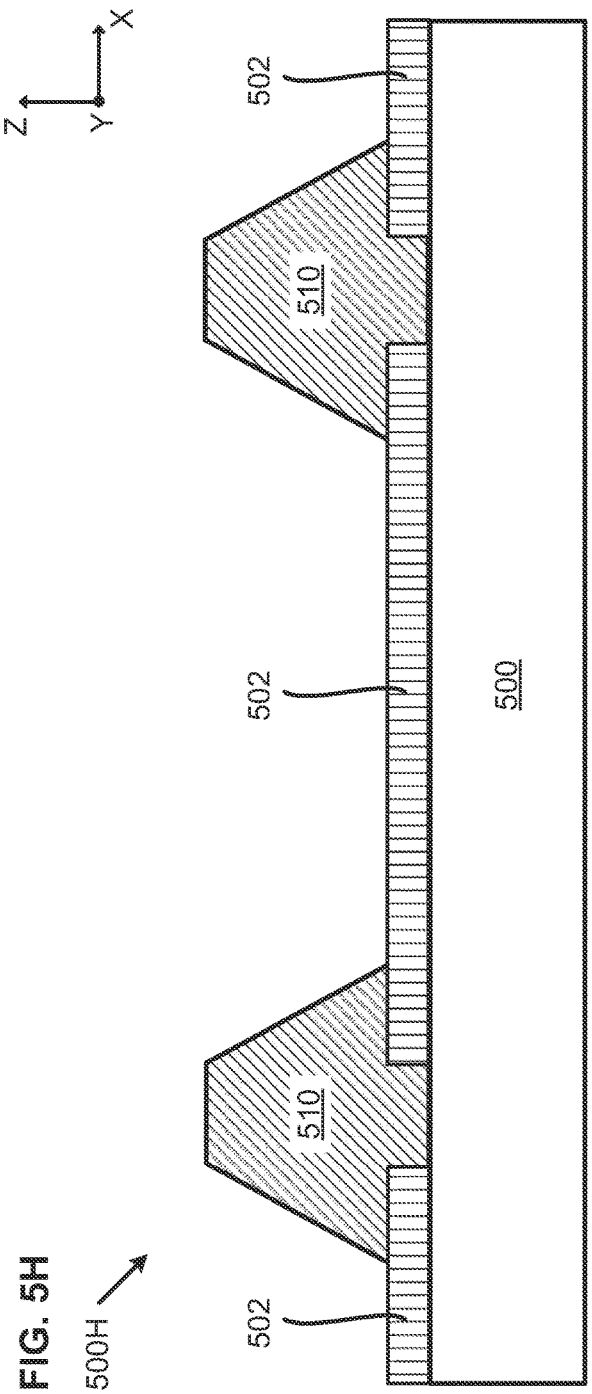

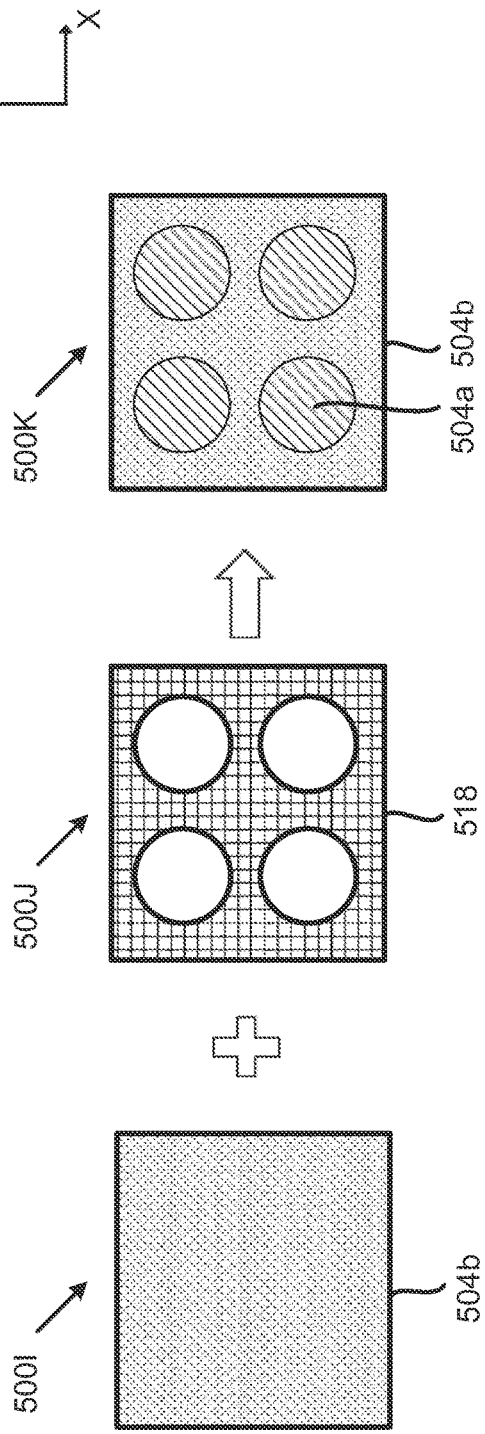
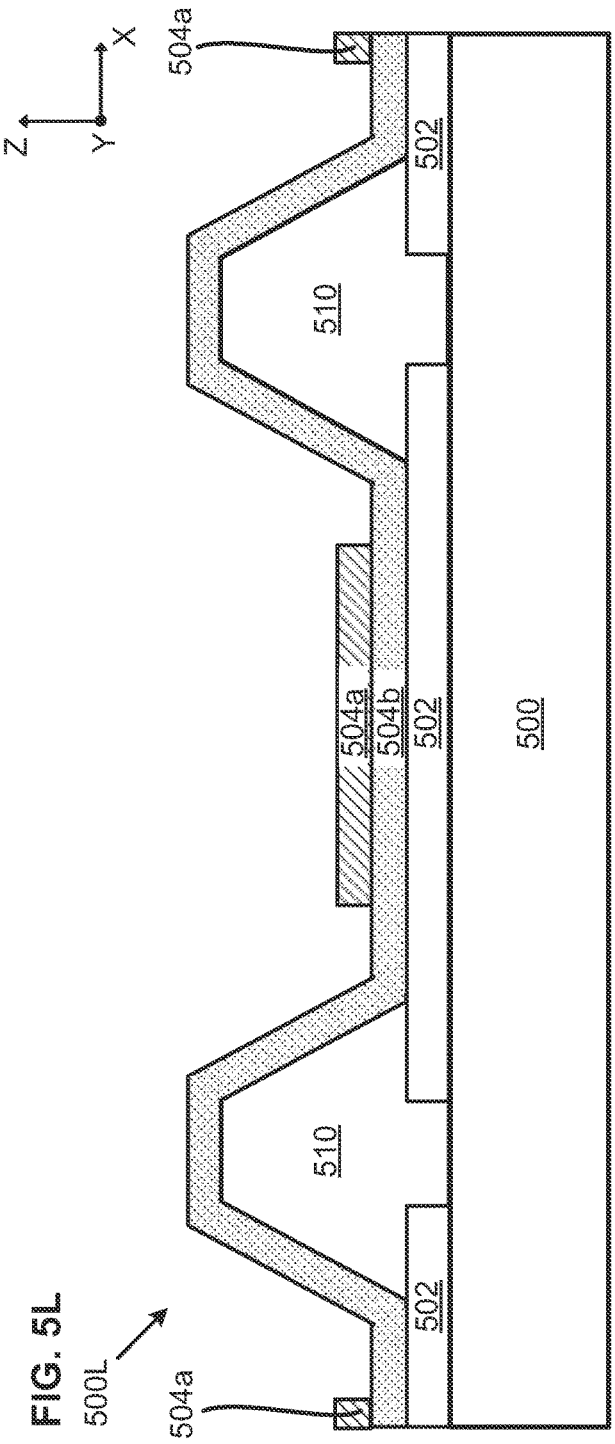

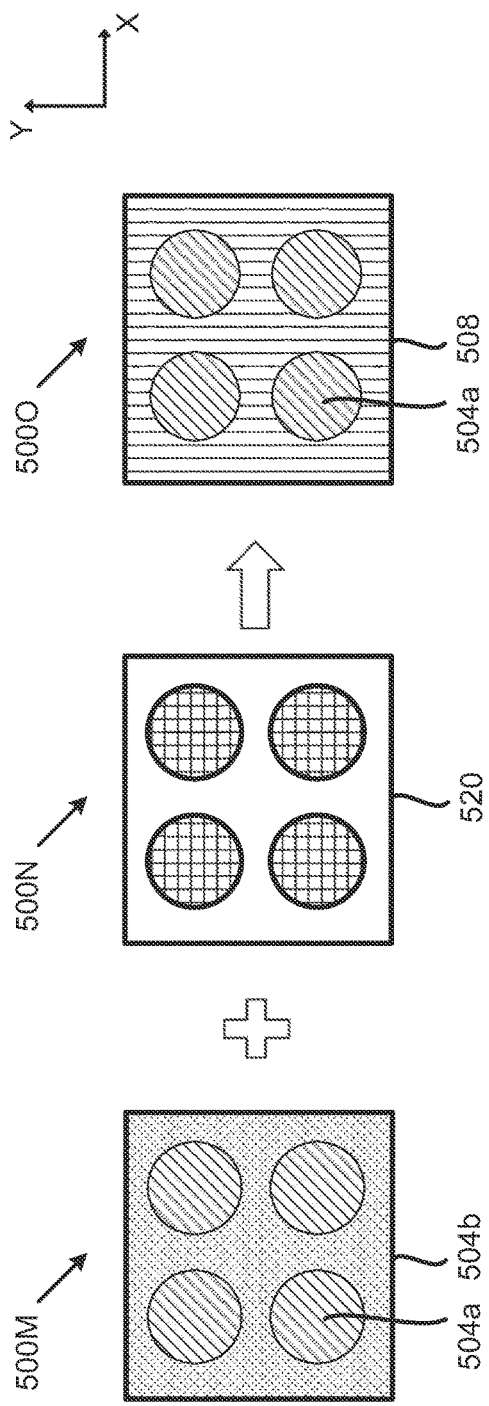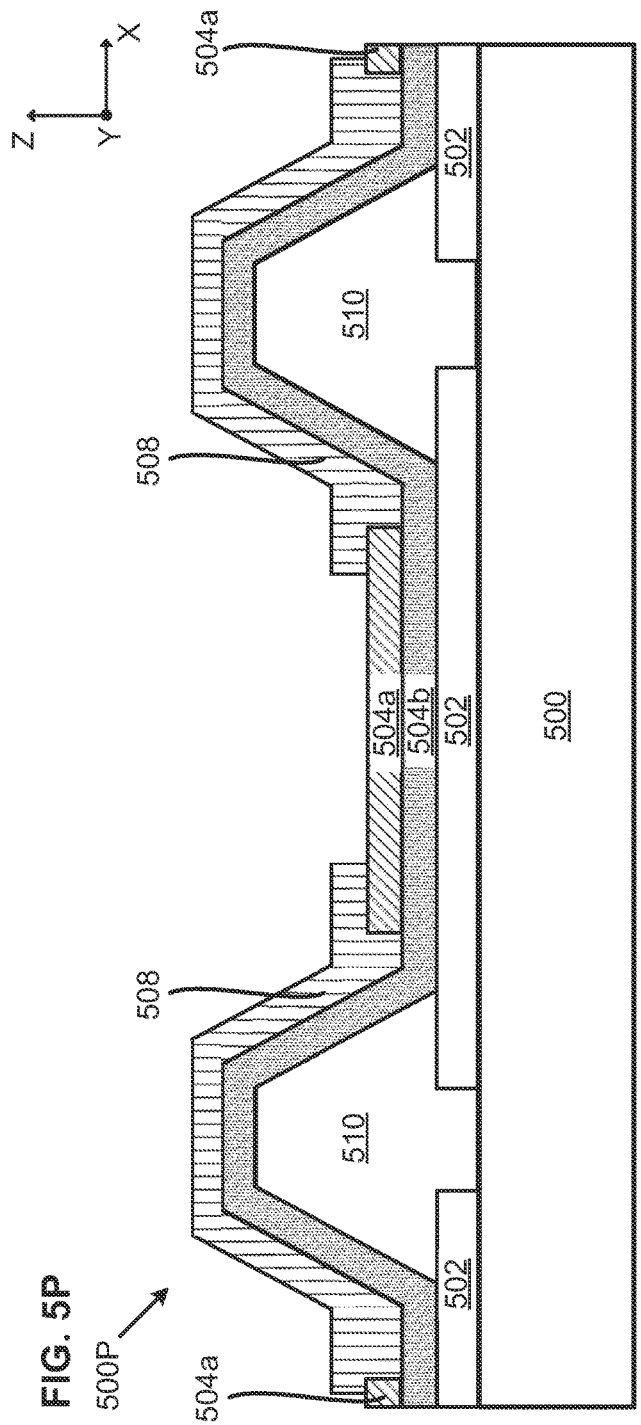

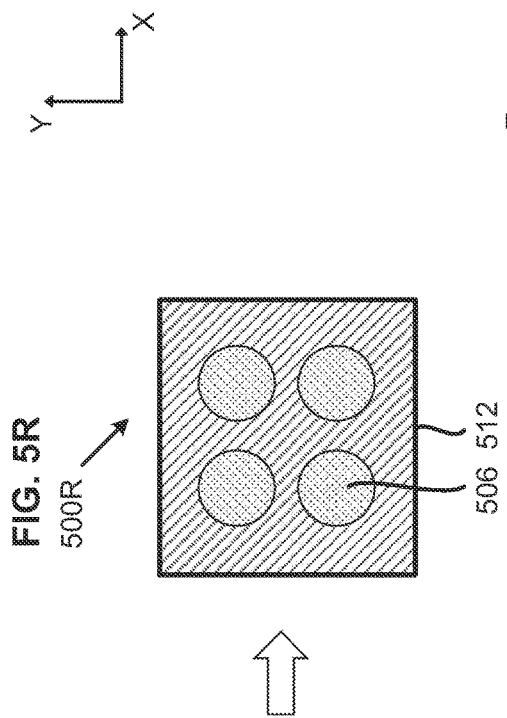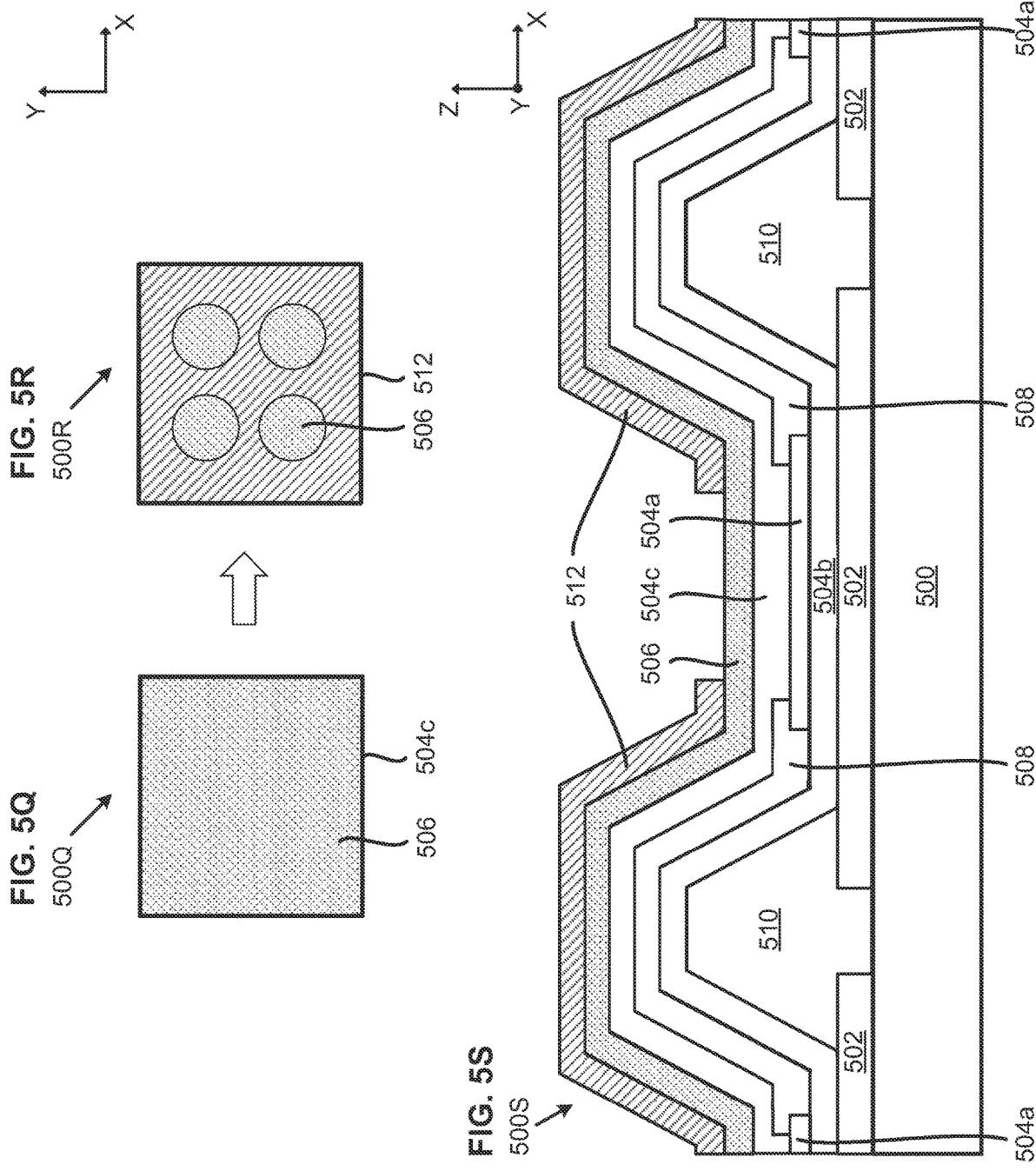

700A

700B

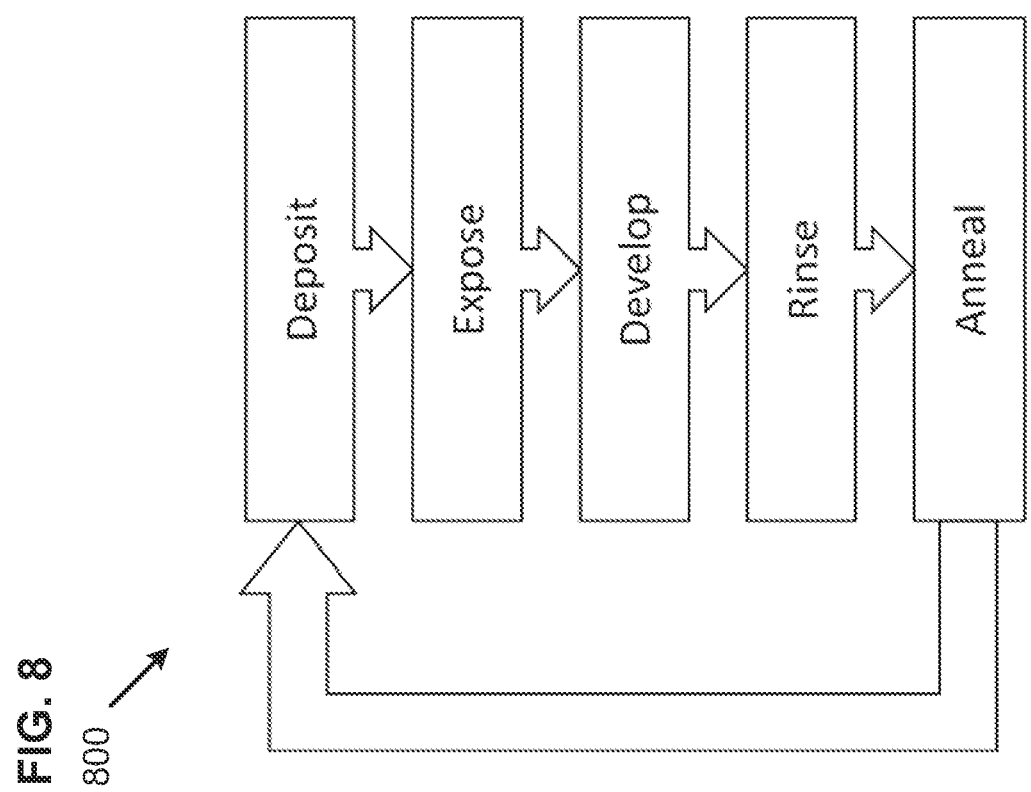

LIGHT-EMITTING STRUCTURE WITH PATTERNED BANK

FIELD

The present disclosure is generally related to layers, bank structures, and emissive devices used in Quantum dot Light-Emitting Diode (QLED) displays. In particular, the present disclosure relates to manufacturing high resolution, multicolor displays using solution processing.

BACKGROUND

In a conventional layered light emissive device, an emissive material is sandwiched between hole transporting and electron transporting layers as well as electrodes (e.g., anode and cathode). This structure operates as a diode and when current flows, electroluminescence in the emissive material creates light, and one electrode is made partially transmissive to allow light extraction. For example, in a light-emissive device 100A of FIG. 1A, a bottom electrode 102 is disposed on a substrate 100, an emissive layer 104 is disposed on a surface of the bottom electrode 102, and a second electrode 106 is disposed on a surface of the emissive layer 104 opposite to the first electrode 102. A bias voltage applied across the electrodes 102, 106 causes a first charge carrier (e.g., holes) to be injected into the emissive layer 104 from one of the two electrodes and an opposite charge carrier (e.g., electrons) to be injected into the other electrode. These charge carriers recombine in the emissive layer, resulting in light being emitted from the device. Additional layers, such as charge injection layers, charge transport layers or charge blocking layers may be disposed between the emissive layer and the electrodes.

In an example, a layered light-emissive device includes an anode that acts as hole injector, a hole transport layer (HTL) that is disposed on the anode, an emissive material layer (EML) that is disposed on the HTL, an electron transport layer (ETL) that is disposed on the EML, and a cathode that also acts as an electron injector disposed on the ETL. Additional layers may be introduced in order to affect the injection, transport and blocking of electrons and/or holes. When a forward voltage bias is applied between the electrodes, holes and electrons are transported in the light-emissive device through the HTLs and ETLs, respectively, and the holes and electrons recombine in the EML, which emits light. When the EML includes an organic material, the light-emissive device is often known as an organic light-emitting diode (OLED) device. When the EML comprises nanoparticles, for example, quantum dots (QDs), the light-emissive device is often known as a quantum dot light-emitting diode (QLED) or alternatively an electroluminescent quantum dot light-emitting diode (ELQLED).

Different approaches in manufacturing multicolor high-resolution light-emissive devices with OLEDS and QLEDs have been suggested. Most of the approaches focus on depositing three different types of materials in three different regions of a substrate such that the three materials emit (by electroluminescence) light of three different colours (e.g., red (R), green (G) and blue (B)). One approach applies individual emissive devices each emitting either a red, a green or a blue color, which are often known as sub-pixels.

To maximize efficiency of OLED and QLED pixels, the structure of the pixels is optimized thoroughly to maximize light extraction efficiency. Pixel structure optimization may require special design such that a maximum amount of light can be directed out of the light-emissive display devices.

Some approaches focus on reflective banks and filler materials to improve extraction efficiency. For example, in a light-emissive device 100B of FIG. 1B, which has a similar structure as the light-emissive device 100A of FIG. 1A, a reflective bank 108 is included to improve extraction efficiency as compared to the light-emissive device 100A. FIG. 1C illustrates a top view of another light-emissive device 100C which includes four circular-shaped light-emissive devices. Each circular-shaped light-emissive device is similar in structure to that of the light-emissive device 100B in FIG. 1B. However, such an approach requires uniform formation of QLED materials on the banked substrate, which can be difficult and costly. A lack of such uniform formation often leads to non-uniform light emissions across the sub-pixels (e.g., 106 in FIG. 1C) due to variation in thickness across the emissive area of the devices. Also, high leakage currents may occur as a result of leakage paths resulting from low resistivity pathways due to the non-uniform deposition on the banked substrates.

Manufacturing of the multiple-layered structures requires sequential solution deposition of various materials. Orthogonal solvents are commonly applied to prevent the coating solution from disturbing the underlying layer. Orthogonal solvents are solvents with widely different polarity, such as ethanol and hexane. Consequently, a film deposited from ethanol is unlikely to be affected by subsequent deposition of a material in a hexane solution and vice versa. However, such solutions may only be effective for a planar structure without any bank. Moreover, during deposition of a non-polar coating solution, if the banks are hydrophobic/lipophilic, the coating solution may preferentially wet the banks instead of the QLED surface, which may lead to the formation of thicker films near banks, which in turn may become detrimental to both device efficiency and uniformity of light emissions.

For example, in a light-emissive device 100D of FIG. 1D, a bottom electrode 102 is disposed on a substrate 100, a bank 108 is formed around the bottom electrode 102 to create a cavity above the bottom electrode 102, and an emissive layer 104 is disposed on the bottom electrode 102 with a non-uniform thickness near the bank 108. When using solution deposition of materials onto a substrate containing banks, materials tend to accumulate at the transition between the substrate 100 and edges of the bank 108, as shown in FIG. 1D. Such non-uniform drying of the wet solvent film is often known as the "coffee ring" effect, which causes poor device performance as layer thickness has dramatic effects on optoelectronic properties, such as substantially affecting light extraction efficiency and uniformity. Similarly, when depositing polar coating solutions onto substrates containing hydrophilic/lipophobic banks, device efficiency and uniformity of light emissions may also be affected, as both polar and non-polar solvents are used during the manufacturing process. Thus, preventing such effects for all layers by applying polar or non-polar banks alone may not be possible.

The present disclosure provides a patterned EML and a complementary insulating layer to improve manufacturing of high-efficiency, high-resolution full color emissive display panels.

SUMMARY

The present disclosure is directed to an emissive display involving a quantum dot electro-emissive material in an LED arrangement.

In accordance with a first aspect of the present disclosure, a light-emitting structure comprises a substrate, a sub-pixel stack patterned over the substrate, an insulating material patterned to surround the emissive stack, and a bank patterned to surround the sub-pixel stack and the insulating material. The sub-pixel stack comprises an emissive stack between a first electrode layer and a second electrode layer.

In an implementation of the first aspect, the emissive stack comprises at least one quantum dot emission material comprising a plurality of QDs.

In another implementation of the first aspect, the emissive stack comprises an emissive layer between a first layered structure and a second layered structure. The first layered structure and the second layered structure each comprise at least one of a charge injection layer, a charge transport layer, and a charge blocking layer.

In yet another implementation of the first aspect, at least one of the first layered structure, the second layered structure, or the emissive layer is patterned by ultraviolet (UV)-induced crosslinking.

In yet another implementation of the first aspect, the insulating material is patterned by UV-induced crosslinking.

In yet another implementation of the first aspect, the insulating material extends over at least a portion of the emissive stack.

In yet another implementation of the first aspect, the light-emitting structure further comprises an auxiliary electrode layer deposited over at least a portion of the second electrode layer.

In yet another implementation of the first aspect, the auxiliary electrode layer extends over at least one bank between two sub-pixel stacks.

In yet another implementation of the first aspect, the light-emitting structure further comprises an array of more than one of the sub-pixel stacks emitting different colors. The bank surrounds each of the more than one sub-pixel stacks.

In accordance with a second aspect of the present disclosure, a light-emitting structure comprises a substrate, a first electrode layer patterned on the substrate, a bank patterned to surround the first electrode layer, a first layered structure disposed over the first electrode layer and the bank, an emissive layer patterned on the first layered structure and above the first electrode layer, an insulating material patterned to surround the emissive layer and extend over the bank, a second layered structure disposed over the emissive layer and the insulating material, and a second electrode layer disposed over the second layered structure. The first layered structure and the second layered structure each comprise at least one of a charge injection layer, a charge transport layer, or a charge blocking layer.

In an implementation of the second aspect, the emissive layer comprises at least one quantum dot emission material comprising a plurality of QDs.

In another implementation of the second aspect, the emissive layer is patterned by UV-induced crosslinking.

In yet another implementation of the second aspect, the insulating material is patterned by UV-induced crosslinking.

In yet another implementation of the second aspect, the insulating material extends over at least a portion of the emissive layer.

In yet another implementation of the second aspect, the light-emitting structure further comprises an auxiliary electrode layer deposited over at least a portion of the second electrode layer.

In yet another implementation of the second aspect, the auxiliary electrode layer extends over the bank.

In accordance with a third aspect of the present disclosure, a manufacturing method of a light-emitting structure comprises patterning a first electrode layer on a substrate, patterning a bank on the substrate to surround the first electrode layer, depositing a first layered structure over the first electrode layer and the bank, patterning an emissive layer over the first layered structure and above the first electrode layer, patterning an insulating material to surround the emissive layer and extend over the bank, depositing a second layered structure over the emissive layer and the insulating material, and depositing a second electrode layer over the second layered structure. The first layered structure and the second layered structure each comprise at least one of a charge injection layer, a charge transport layer, or a charge blocking layer.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

FIG. 2B is a schematic cross-sectional view of an example light-emitting structure in accordance with an example implementation of the present disclosure.

FIG. 2C is a schematic cross-sectional view of an example light-emitting structure in accordance with an example implementation of the present disclosure.

FIGS. 3A-3G are schematic diagrams illustrating an example method of manufacturing a light-emitting structure in accordance with an example implementation of the present disclosure.

FIGS. 5A-5S are schematic diagrams illustrating an example method of manufacturing a light-emitting structure in accordance with an example implementation of the present disclosure.

FIG. 8 is schematic flow diagram illustrating an example method of patterning layers of a light-emitting structure in accordance with an example implementation of the present disclosure.

DESCRIPTION

Figure 1A:
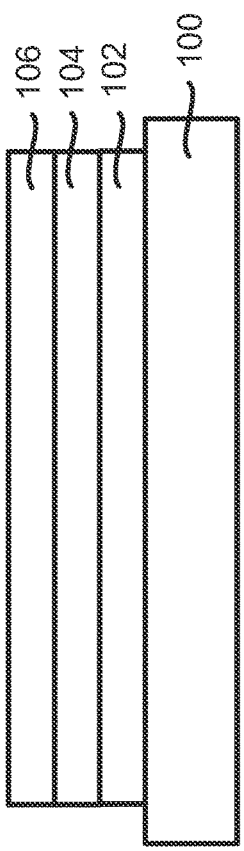
FIG. 1A is a schematic cross-sectional view of a sub-pixel stack in a related art light-emitting structure.
Figure 1B:
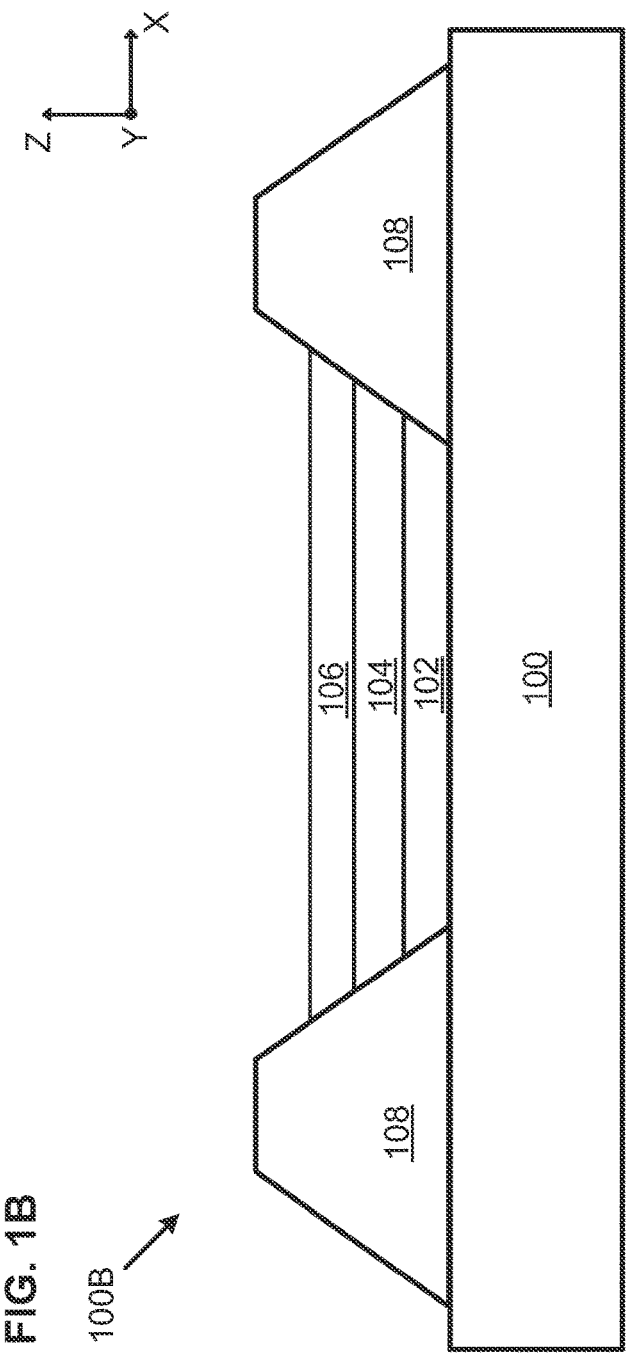
FIG. 1B is a schematic cross-sectional view of another related art light-emitting structure.
Figure 1C:
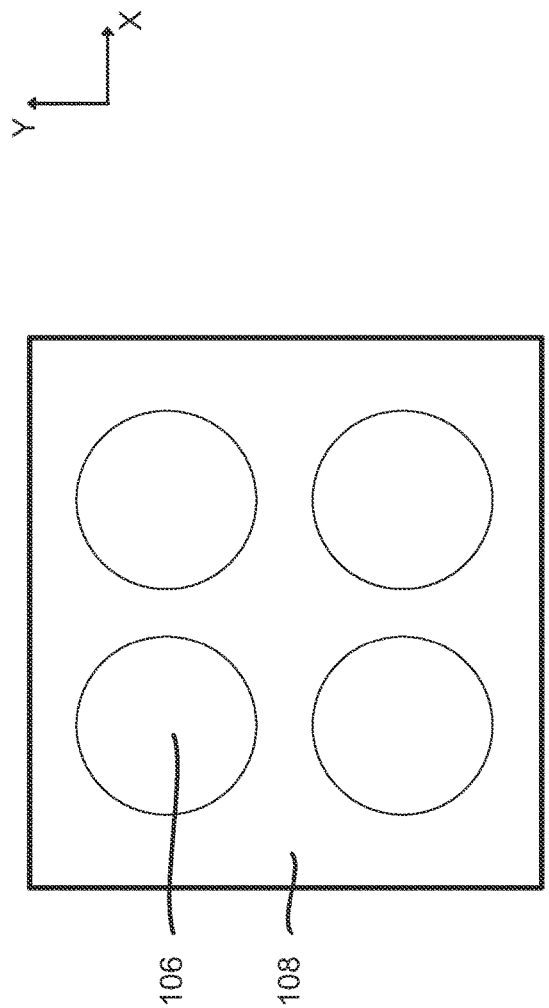
FIG. 1C is a schematic top view of another related art light-emitting structure.
Figure 1D:
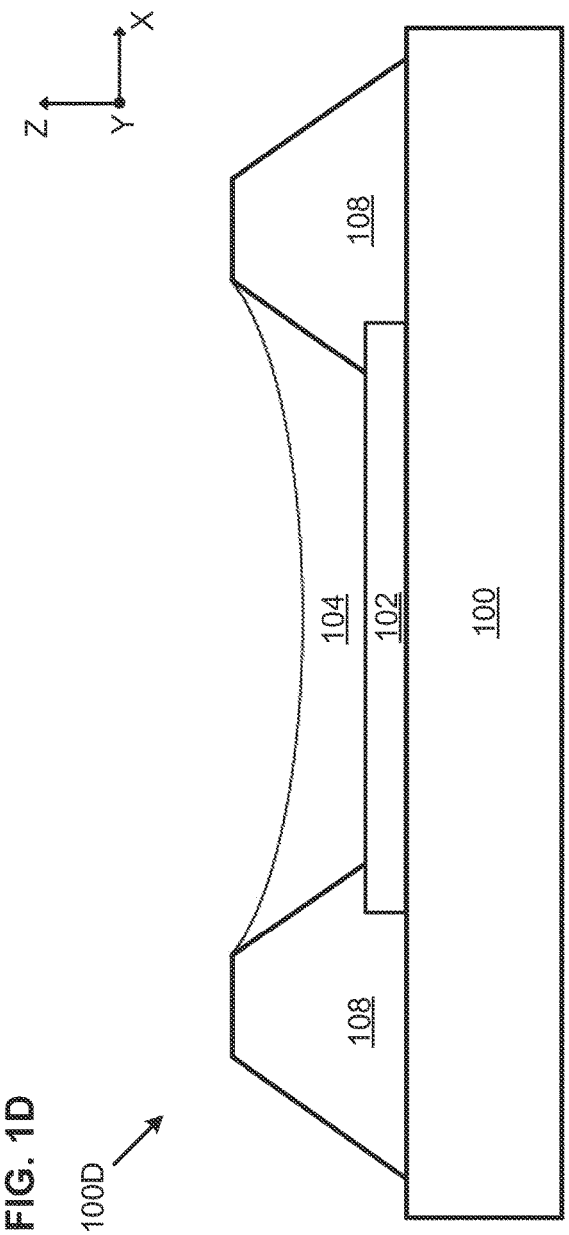
FIG. 1D is a schematic cross-sectional view of another related art light-emitting structure.

The following disclosure contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art.

Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purposes of consistency and ease of understanding, like features may be identified (although, in some examples, not shown) by the same numerals in the example figures. However, the features in different implementations may be different in other respects, and thus shall not be narrowly confined to what is shown in the figures.

The description uses the phrases "in one implementation," or "in some implementations," which may each refer to one or more of the same or different implementations. The term "comprising" means "including, but not necessarily limited to" and specifically indicates open-ended inclusion or membership in the so-described combination, group, series and the equivalent. The expression "at least one of A, B and C" or "at least one of the following: A, B and C" means "only A, or only B, or only C, or any combination of A, B and C."

Additionally, for the purposes of explanation and non-limitation, specific details, such as functional entities, techniques, protocols, standards, and the like are set forth for providing an understanding of the described technology. In other examples, detailed description of well-known methods, technologies, systems, architectures, and the like are omitted so as not to obscure the description with unnecessary details.

The present disclosure relates to an emissive display involving a quantum dot electro-emissive material in a light-emitting diode (LED) arrangement. Although one or more implementations of the present disclosure are described with reference to displays with QLED pixels, the example implementations provided herein do not limit the scope of the present disclosure and may also be applied in other displays and structures, such as OLED structures. In one or more implementations of the present disclosure, a "top" emitting (TE) structure is applied. The TE structure involves light emission from a side of the TE structure opposite a glass substrate on which the TE structure is disposed.

In one or more implementations of the present disclosure, manufacturing of a TE device involves one layer of conductive reflective material, typically made of a metal (e.g., silver or aluminium) deposited on the glass substrate, with an HTL layer on the conductive reflective layer (e.g., a reflective conductor or reflective electrode), an emissive layer on the HTL layer, an ETL layer on the emissive layer, and a transparent electrode layer on the ETL layer. However, the HTL, the ETL, and the emissive layer are described as an emissive layer for brevity in the present disclosure.

Figure 2A:
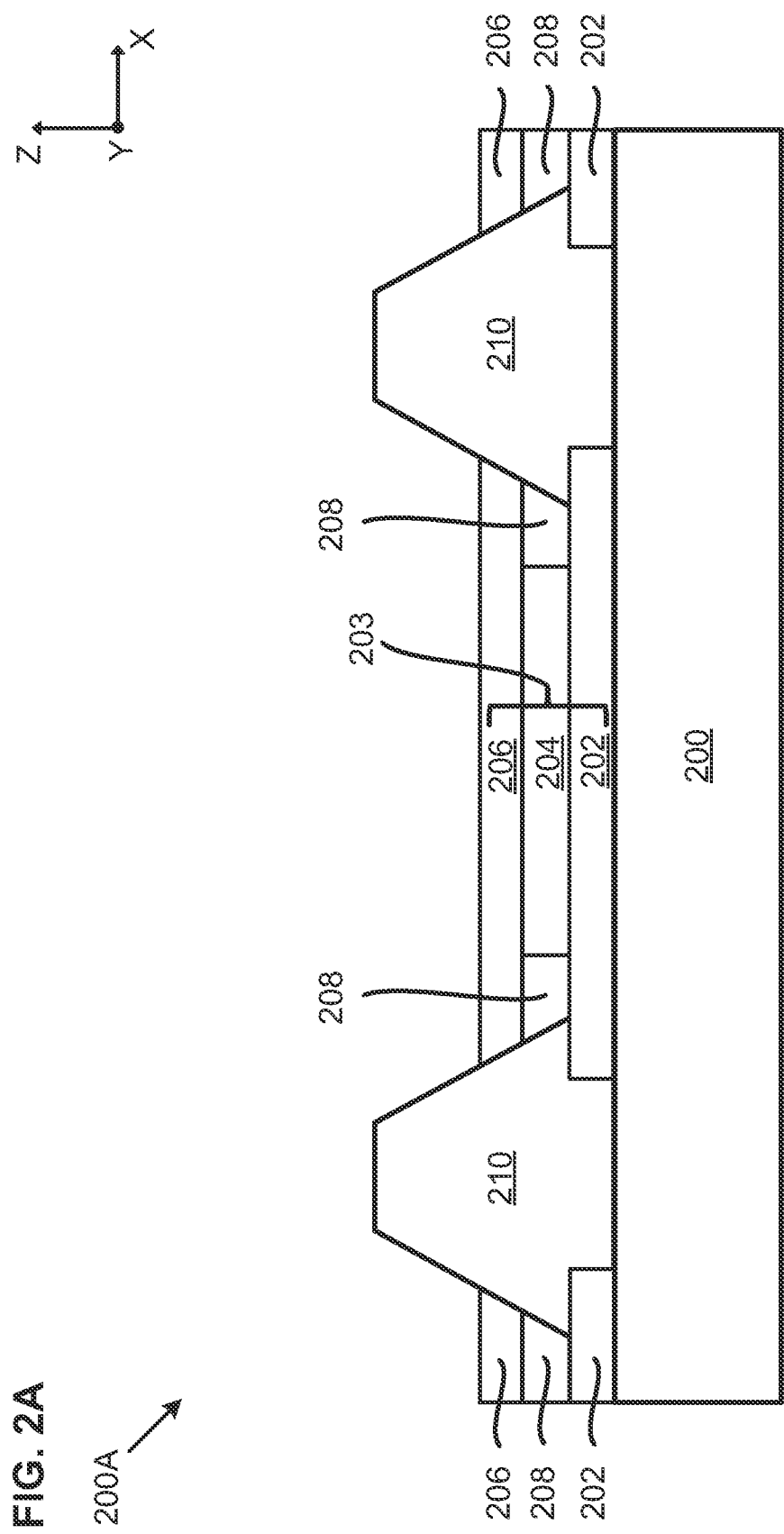
FIG. 2A is a schematic cross-sectional view of an example light-emitting structure in accordance with an example implementation of the present disclosure.

FIG. 2A is a schematic cross-sectional view of an example light-emitting structure in accordance with an example implementation of the present disclosure. In FIG. 2A, an example light-emitting structure 200A may include a substrate 200, a sub-pixel stack 203, an insulating material 208, and a bank 210. In one or more implementations of the present disclosure, the sub-pixel stack 203 may include an emissive stack 204 disposed between a first electrode layer 202 and a second electrode layer 206 and may be patterned over the substrate 200. The first electrode layer 202 may be patterned on the substrate 200, the insulating material 208 may be patterned to surround the emissive stack 204, and the bank 210 may be patterned to surround the sub-pixel stack 203 and the insulating material 208. In other implementations of the present implementations, the light-emitting structure 200A may include one or more additional layers, which may be one or more transport layers (e.g., hole transport layer, electron transport layer) and/or one or more injection layers (e.g., hole injection layer, electron injection layer). In other implementations of the present disclosure, by carefully selecting the size, shape, and reflectivity of a surface of the bank, extraction efficiency of the light-emitting structure 200A may be substantially improved when compared to structures without a bank. The sub-pixel stack 203 surrounded by the bank 210 may be any shape and arranged in many different layouts.

In one or more implementations of the present disclosure, the substrate 200 may include, for example, glass substrates and polymer substrates. In other implementations, the substrate 200 may include materials such as polyimides, polyethenes, polyethylenes, polyesters, polycarbonates, polyethersulfones, polypropylenes, and/or polyether ether ketones. The substrate 200 may be any suitable shape and size. In some implementations, dimensions of the substrate 200 may allow for more than one light-emitting structure to be provided thereon. In an implementation, a major surface of the substrate 200 may provide an area for multiple light-emitting structures of the present disclosure to be formed as sub-pixels of a pixel. In another implementation, a major surface of the substrate 200 may provide an area for multiple pixels to be formed thereon, each pixel including a sub-pixel arrangement of light-emitting structures.

In one or more implementations of the present disclosure, the first electrode layer 202 may be reflective and a metal. The second electrode layer 206 may be a transparent or semi-transparent electrode. In other implementations, the first electrode layer 202 may be a transparent or semi-transparent electrode while the second electrode layer 206 may be a reflective metal. The emissive stack 204 may be deposited on the first electrode layer 202 from solutions with techniques such as spin coating, slot-dye coating, doctor blading, spray coating or ink-jet printing. The second electrode layer 206 may be deposited on the emissive stack 204. The sub-pixel stack 203 may be deposited by techniques such as sputter coating, thermal evaporation, spin coating, slot-dye coating, doctor blading, spray coating or ink-jet printing.

In one or more implementations of the present disclosure, the first electrode layer 202 may act as an anode, with the second electrode layer 206 acting as a cathode. When an electrical forward-bias voltage is applied across the first electrode layer 202 and the second electrode layer 206, light is emitted when holes and electrons recombine in the emissive stack 204. The example implementation above regarding the first electrode layer 202 (e.g., anode) and the second electrode layer 206 (e.g., cathode) may be reversed, where the first electrode layer 202 may act as a cathode and the second electrode layer 206 may act as an anode, thus producing an "inverted device". The present disclosure is equally applicable to either one of the device architectures above.

In one or more implementations of the present disclosure, the first and second electrode layers 202, 206 may include one or more metals (e.g., aluminum, gold, silver, platinum, magnesium, and the like, as well as any alloys thereof) or metal oxides (e.g., indium tin oxide (ITO), indium-doped zinc oxide (IZO), fluorine-doped tin oxide (FTO), aluminum-doped zinc-oxide (AZO), indium-doped cadmium-oxide, and the like). The first and second electrode layers 202, 206 may also be provided in any suitable arrangement. For example, the first and second electrode layers 202, 206 may address a thin-film transistor (TFT) circuit.

In one or more implementations of the present disclosure, the emissive stack 204 may further include an emissive layer, a first layered structure, and a second layered structure, each of which may be patterned. In one implementations, at least one of the first layered structure, the second layered structure, or the emissive layer is patterned by ultraviolet (UV)-induced crosslinking. The first and second layered structures each may include at least one of a charge injection layer, a charge transport layer, and a charge blocking layer (not explicitly shown). The emissive layer may include a crosslinked matrix of one or more crosslinked charge transport materials. The emissive layer may contain quantum dots (QDs) which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_xTe_{1-x}$, $ZnSe_xTe_{1-x}$, perovskites of the form $ABX_3$, $Zn_wCu_zIn_{1-(w+z)}S$, and carbon, where $0 \le w, x, y, z \le 1$ and $(w+z) \le 1$. In some implementations, the QDs may be embodied as nanoparticles. In other implementations, the QDs may include ligands. The ligands may be provided on the outer surface of the QDs. For example, the QDs may include a core, a shell around the core, and ligands around the shell. In other implementations, the quantum dots may include a core, a shell around the core, an oxide layer (e.g., an $Al_2O_3$ layer or a layer of another suitable metal oxide) around the shell, and ligands around the oxide layer. In other implementations, the ligands may be organic materials facilitating QDs dispersible in the crosslinkable charge transport material that is used in forming the emissive layer. In some implementations, the ligands may include a functional group that may interact with the crosslinkable charge transport material (e.g., via external stimuli such as temperature, pressure, and/or radiation, etc.) in forming the emissive layer. Exemplary functional groups of the ligands may include thiols, alkenes, alkynes, and carbonyl and/or carboxyl functional groups. In some implementations, the QDs may include ligands that may not interact with the charge transport material in forming the matrix. More specifically, the ligands and charge transport material may be selected such that the ligands do not interact with the charge transport material to incorporate the QDs as part of the formed matrix. In other implementations, the QDs may not include ligands.

In one or more implementations, the QDs ligands are crosslinked with each other through a reaction with a linker molecule under ultraviolet exposure to form the emissive layer. Methods for crosslinking QDs are not limited to the examples provided herein.

In one or more implementations of the present disclosure, the insulating material 208 may be patterned with ultraviolet (UV)-induced crosslinked charge transport materials, which include UV-induced crosslinked hole transport materials and/or UV-induced crosslinked electron transport materials. As such, a matrix of one or more UV-induced crosslinked charge transport materials may be formed from one or more types of crosslinkable materials. Such materials include one or more hole transport materials and/or one or more electron transport materials. In some implementations, the crosslinkable hole transport material may be an effective hole transporter, whether with or without crosslinking. In other implementations, the crosslinkable hole transport material may be an effective hole transporter only when crosslinked. In some implementations, the crosslinkable electron transport material may be an effective electron transporter whether with or without crosslinking. In other implementations, the crosslinkable electron transport material may an effective electron transporter only when crosslinked. In some implementations, the crosslinked charge transport materials may include one or more of hole injection materials, electron injection materials, hole blocking materials, electron blocking materials, and/or interconnecting materials (ICM).

In some implementations, the UV-induced crosslinked charge transport material may include one of at least two moieties of a molecule in which one moiety may provide charge transporting properties and another moiety may provide UV-crosslinking capabilities. Exemplary moieties that may provide charge transporting properties include, but are not limited to, tertiary, secondary, and primary aromatic or aliphatic amines, tryaryl phosphines, and quinolinolates. Exemplary moieties that may provide UV-crosslinking capabilities include, but are not limited to, oxetane, epoxy, thiol, alkene, alkyne, ketone, and aldehyde units. In some implementations, the two moieties may be connected to one another with a distance of less than 20 nm therebetween. In some implementations, a crosslinkable material may be N4,N4'-Bis(4-(6-((3-ethyloxetan-3-yl)methoxy)hexyl)phenyl)-N4,N4'-diphenylbiphenyl-4,4'-diamine (OTPD). In some implementations, the emissive layer may be formed using one or more photo-initiators. As such, the emissive layer may include one or more photo-initiators, which are materials that initiate polymerizations by a light stimuli. In some implementations, the photo-initiator may generate one or more radicals, ions, acids, and/or species that may initiate such polymerization. Such a photo-initiator may generate one or more of, but are not limited to, cationic species and/or radicals, Brönsted acids, carbenium ions, or onium ions by light irradiation. The photo-initiators may include sulfonium-salts and iodonium-salts (e.g., triphenylsulfonium triflate and diphenyliodonium triflate).

In some implementations, the emissive layer may be configured such that the UV-induced crosslinked charge transport material includes one or more UV-induced crosslinked hole transport materials. An electron transport layer may be included to induce electron movements in the light-emitting structure and through to the emissive layer. The electron transport layer may be made from any suitable materials. In some implementations, the electron transport layer may include one or more of ZnO, 8-quinolinolato lithium (Liq.), LiF, $Cs_2CO_3$, $Mg_xZn_{1-x}O$ (where $0 \le x \le 1$), $Al_xZn_{1-x}O$ (where $0 \le x \le 1,2,2',2''$-(1,3,5-benzinetriyl)-tris(1-phenyl-1-H-benzimidazole) (TPBi)), $TiO_2$, $ZrO_2$, N4,N4'-Di(naphthalen-1-yl)-N4,N4'-bis(4-vinylphenyl)biphenyl-4,4'-diamine (VNPB), and 9,9-Bis[4-[(4-ethenylphenyl)methoxy]phenyl]-N2,N7-di-1-naphthalenyl-N2,N7-diphenyl-9H-Fluorene-2,7-diamine (VB-FNPD).

In some implementations, a hole transport layer may include one or more layers configured to transport holes from an electrode (e.g., anode) to the emissive layer. The hole transport layer may be made from any suitable material(s). In some implementations, the hole transport layer may include one or more of poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-

((3-ethyloxetan-3-yl)methoxy)hexyloxy)phenyl)-N4,N4'-bis(4-methoxyphenyl)biphenyl-4,4'-diamine (QUPD), and N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC). In some implementations where the hole transport layer includes more than one layer, the material of one of the respective layers may differ from the material of one or more of the other layers.

In some implementations, the hole transport layer may not include a crosslinkable transport material. In other implementations, the hole transport material may include one or more crosslinkable transport materials. In some implementations where the hole transport material includes one or more crosslinkable transport materials, the crosslinked matrix within the emissive layer may be crosslinked to (and extend into) the hole transport layer.

In still other implementations, the light-emitting structure of the present disclosure may include one or more additional layers. Examples include a hole injection layer and/or an electron injection layer. Exemplary materials suitable for use in a hole injection layer include, but are not limited to, poly(3,4-ethylenedioxythiophene) polystyrene sulfonate (PEDOT:PSS), $MoO_3$:PEDOT:PSS; $V_2O_5$, $WO_3$, $MoO_3$, 2,3,5,6-tetrafluoro-7,7,8,8-tetracyanoquinodimethane (F4TCNQ), and/or 1,4,5,8,9,11-hexaazatriphenylenehexacarbonitrile (HATCN). Exemplary materials suitable for use in an electron injection layer may include, but are not limited to, 8-quinolinolato lithium (Liq), LiF, and/or $Cs_2CO_3$.

With the material close to the bank 210 filled with the insulating material 208 instead of the emissive stack 204 in the example light-emitting structure 200A, uniform light emissions may be achieved.

FIG. 2B is a schematic cross-sectional view of an example light-emitting structure in accordance with an example implementation of the present disclosure. FIG. 2C is a schematic cross-sectional view of an example light-emitting structure in accordance with an example implementation of the present disclosure.

In FIG. 2B, an example light-emitting structure 200B may be substantially similar to that of the example light-emitting structure 200A in FIG. 2A. The example light-emitting structure 200B may include a substrate 200, a sub-pixel stack 203 patterned over the substrate 200 and having an emissive stack 204 disposed between a first electrode layer 202 and a second electrode layer 206, an insulating material 208 patterned to surround the emissive stack 204, and a bank 210 patterned to surround the sub-pixel stack 203 and the insulating material 208 that may correspond to the substrate 200, the sub-pixel stack 203, the insulating material 208, and the bank 210 of the example light-emitting structure 200A in FIG. 2A. Therefore, the details of the example light-emitting structure 200B are omitted for brevity. The example light-emitting structure 200B in FIG. 2B of the present disclosure differs from the light-emitting structure 200A in FIG. 2A in that the structure 200B may include an auxiliary electrode layer 212 disposed over at least a portion of the second electrode layer 206. In some implementations, the auxiliary electrode layer 212 may be deposited over at least a portion of the second electrode layer 206. In some implementations, the auxiliary electrode layer 212 may include a transparent conductor and a metal (e.g., silver or the like) to increase conductivity without compromising light transmission in an active emission area. With the material close to the bank 210 filled with the insulating material 208 instead of the emissive stack 204 in the example light-emitting structure 200B, uniform light emissions may be achieved.

In FIG. 2C, an example light-emitting structure 200C may include a substrate 200, a sub-pixel stack 203M patterned over the substrate 200 and having an emissive stack 204M disposed between a first electrode layer 202M and a second electrode layer 206M, an insulating material 208M patterned to surround the emissive stack 204M, and a bank 210 patterned to surround the sub-pixel stack 203M and the insulating material 208M that may correspond to the substrate 200, the sub-pixel stack 203, the insulating material 208, and the bank 210 of the example light-emitting structure 200A in FIG. 2A. Therefore, the details of the example light-emitting structure 200C are omitted for brevity. The example light-emitting structure 200C in FIG. 2C of the present disclosure differs from the light-emitting structure 200A in FIG. 2A in that the structure 200C may include an auxiliary electrode layer (212LM or 212RM) disposed or deposited to extend over at least one bank between two sub-pixel stacks as shown in FIG. 2C. For example, the example light-emitting structure 200C in FIG. 2C may illustrate the sub-pixel stack 203M and two sub-pixel stacks 203L, 203R arranged adjacent to the sub-pixel stack 203M. The sub-pixel stack 203L may be patterned over the substrate 200 and may have an emissive stack 204L disposed between a first electrode layer 202L and a second electrode layer 206L, an insulating material 208L patterned to surround the emissive stack 204L, and the bank 210 patterned to surround the sub-pixel stack 203L and the insulating material 208L. The sub-pixel stack 203R may be patterned over the substrate 200 and may have an emissive stack 204R disposed between a first electrode layer 202R and a second electrode layer 206R, an insulating material 208R patterned to surround the emissive stack 204R, and the bank 210 patterned to surround the sub-pixel stack 203R and the insulating material 208R. One auxiliary electrode layer 212LM may be disposed or deposited to extend over the bank 210 between two sub-pixel stacks 203L, 203M. Another auxiliary electrode layer 212RM may be disposed or deposited to extend over the bank 210 between two sub-pixel stacks 203M, 203R. The example light-emitting structure 200C in FIG. 2C may illustrate only portions of the two sub-pixel stacks 203L, 203R; however, the structure of each of the two sub-pixel stacks 203L, 203R is similar to the structure of the sub-pixel stack 203M, thus structural details of the two sub-pixel stacks 203L, 203R are omitted for brevity. The example light-emitting structure 200C in FIG. 2C may include the example sub-pixel stacks 203L, 203M, 203R, insulating materials 208L, 208M, 208R, and auxiliary electrode layers 212LM, 212RM in an array arrangement of pixels; however, the example light-emitting structure 200C may further include one or more sub-pixel stacks, insulating materials, and auxiliary electrode layers in an array having greater number of pixels. With an auxiliary electrode layer (212LM or 212RM) provided in an array having plurality of pixels, electrical charge transport between pixels, as well as charge injection into the pixels, may be improved to compensate for potentially low conductivity of the second electrode layer (206L, 206M, 206R). In some implementations, each auxiliary electrode layer (212LM or 212RM) may include a metal (e.g., silver or the like) to increase conductivity without compromising light transmission in an active emission area. In one or more implementations, two or more auxiliary electrode layers or auxiliary electrodes (212LM, 212RM) may be formed of a same material and/or may be interconnected to form one single auxiliary electrode layer. With the material close to the bank (210) filled with the insulating material (208L, 208M, 208R) instead of the emissive stack (204L, 204M, 204R), uniform light emissions may be achieved.

Figure 3C:
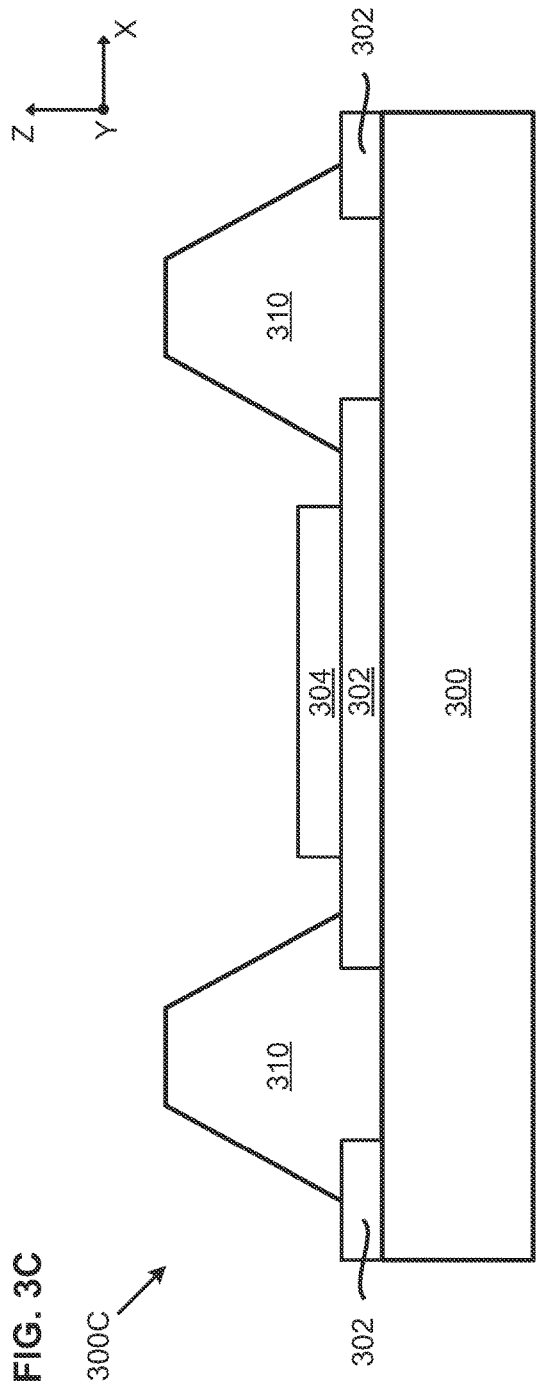
Figure 3D:
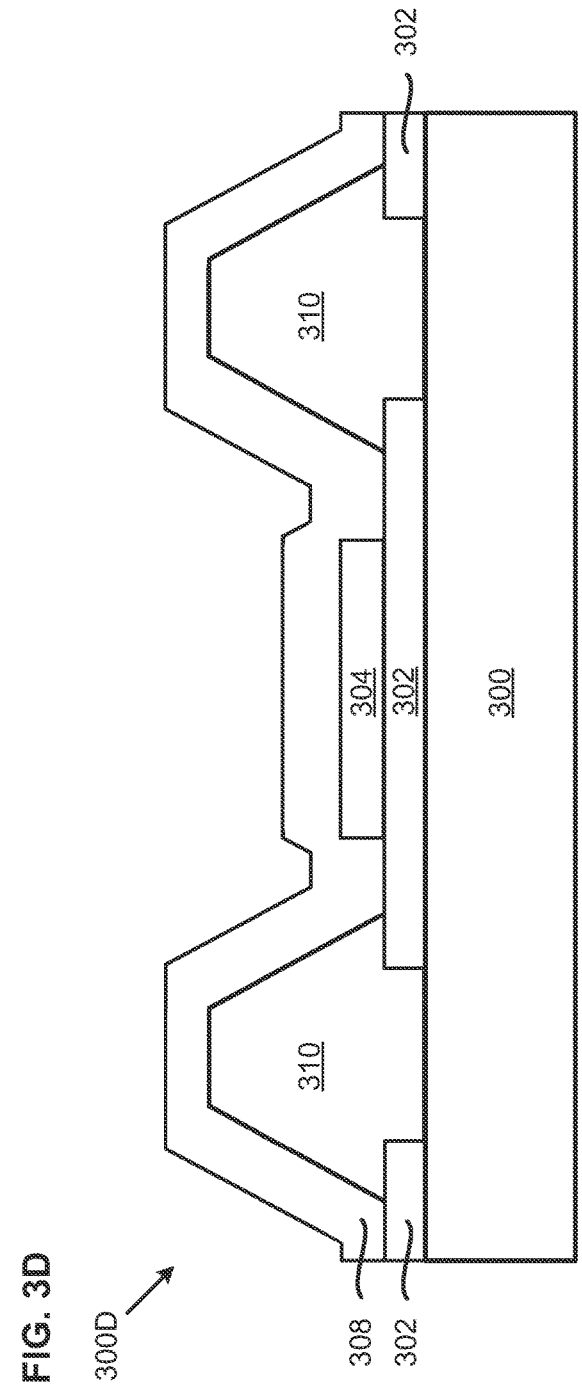
Figure 3G:
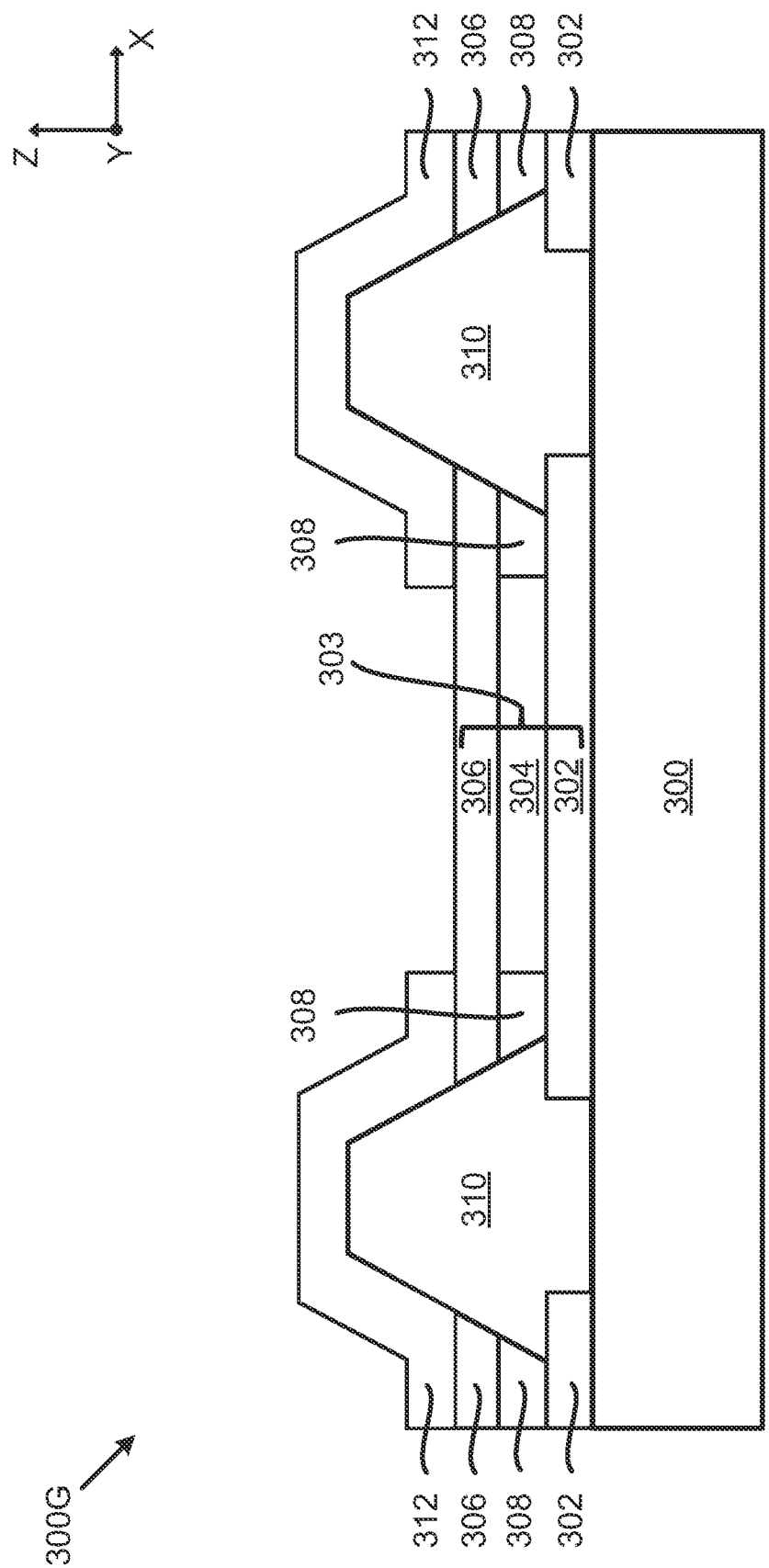

FIGS. 3A-3G are schematic diagrams illustrating an example method of manufacturing a light-emitting structure in accordance with an example implementation of the present disclosure. The example method illustrated by FIGS. 3A-3G may include actions 300A-300F to provide an example light-emitting structure 300G similar to the light-emitting structure 200C in FIG. 2C. Thus, details of the light-emitting structure 300F in FIG. 3G are omitted for brevity.

As illustrated in FIG. 3A, a first electrode layer 302 may be patterned on a substrate 300 in action 300A. In FIG. 3B, a bank 310 may be patterned to surround the first electrode layer 302 in action 300B. In FIG. 3C, an emissive stack 304 may be patterned on the first electrode layer 302 in action 300C. In FIG. 3D, an insulating material 308 may be disposed or deposited over the emissive stack 304 and the bank 310 in action 300D. In FIG. 3E, the insulating material 308 may be patterned to surround the emissive stack 304 in action 300E. In FIG. 3F, a second electrode layer 306 may be patterned over the emissive stack 304 and the insulating material 308 in action 300F. In FIG. 3G, an auxiliary electrode layer 312 may be deposited over at least a portion of the second electrode layer 306 to result in the example light-emitting structure 300G. With the material close to the bank 310 filled with the insulating material 308 instead of the emissive stack 304 in the example light-emitting structure 300G, uniform light emissions may be achieved.

Figure 4:
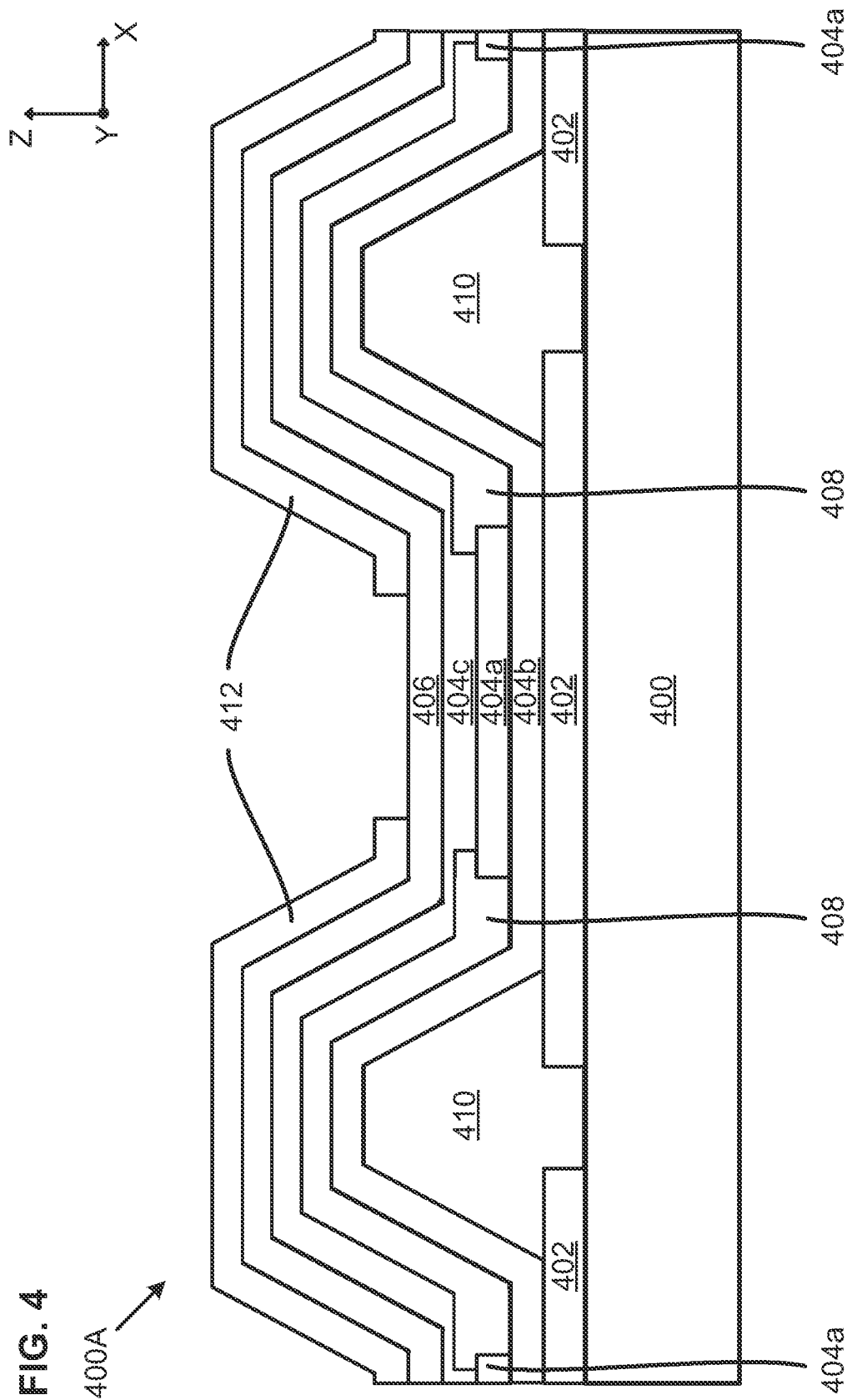
FIG. 4 is a schematic cross-sectional view of an example light-emitting structure in accordance with an example implementation of the present disclosure.

FIG. 4 is a schematic cross-sectional view of an example light-emitting structure in accordance with an example implementation of the present disclosure.

In FIG. 4, an example light-emitting structure 400A may include a substrate 400, a first electrode layer 402, a first layered structure 404b, an emissive layer 404a, a second layered structure 404c, a second electrode layer 406, an insulating material 408, a bank 410, and an auxiliary electrode layer 412. In one or more implementations, the first electrode layer 402 may be patterned on the substrate 400. The bank 410 may be patterned to surround the first electrode layer 402. The first layered structure 404b may be disposed over the first electrode layer 402 and the bank 410. The emissive layer 404a may be patterned on the first layered structure 404b and above the first electrode layer 402. The insulating material 408 may be patterned to surround the emissive layer 404a and extend over the bank 410. In one or more implementations, the thickness of the insulating material 408 over (overlap with) the emissive layer 404a may be the same in thickness as the thickness of the emissive layer 404a. In some implementations, the thickness of the insulating material 408 over (overlap with) the emissive layer 404a may be slightly different in portions between the bank 410 and on top of the emissive layer 404a. The second layered structure 404c may be disposed over the emissive layer 404a and the insulating material 408. The second electrode layer 406 may be disposed over the second layered structure 404c. The auxiliary electrode layer 412 may be disposed over the second electrode layer 406. In one or more implementations, the first layered structure 404b and the second layered structure 404c each include at least one of a charge injection layer, a charge transport layer, or a charge blocking layer. In some implementations, the first layered structure 404b, the second layered structure 404c, and the second electrode layer 406 may not necessarily be patterned, thus simplifying manufacture. In one or more implementations, the insulating material 408 may extend over at least a portion of the emissive layer 404a, as depicted in FIG. 4. In other words, the insulating material 408 and the emissive layer 404a may overlap with each other to prevent current leakage.

FIGS. 5A-5S are schematic diagrams illustrating an example method of manufacturing a light-emitting structure in accordance with an example implementation of the present disclosure.

One or more implementations of the manufacturing method for a light-emitting structure in accordance with the present disclosure may be illustrated by FIGS. 5A-5S, actions 500A-B, 500E-F, 500I-J, 500M-N, and 500Q, and example light-emitting structures 500C-D, 500G-H, 500K-L, 500O-P, and 500R-S. The example light-emitting structure 500S may be similar to the example light-emitting structure 400 in FIG. 4. Thus, details of the example light-emitting structure 500S in FIG. 5S are omitted for brevity.

FIGS. 5A-5C illustrate a top view of one implementation of the example manufacturing method in accordance with the present disclosure. In action 500A, a substrate 500 may be provided with a first electrode layer 502 disposed (e.g., deposited) over the substrate 500. In action 500B, an electrode photomask 514 may be positioned above the substrate 500. The cross-hatched pattern on the photomask 514 may prevent light transmission through the photomask 514 while the empty area (without the cross-hatched pattern) may allow light transmission through the photomask 514. With reference to FIG. 5C, by exposing the first electrode layer 502 in FIG. 5A through the electrode photomask 514 in FIG. 5B with a light source (e.g., UV, not shown), the first electrode layer 502 may be patterned (e.g., including development, rising, and annealing) on the substrate 500 as shown in the example light-emitting structure 500C of FIG. 5C. FIG. 5D illustrates an example light-emitting structure 500D, which is a cross-sectional view of the example light-emitting structure 500C of FIG. 5C, fabricated by the actions 500A and 500B of the example manufacturing method in accordance with the present disclosure.

FIGS. 5E-5G illustrate a top view of one implementation of the example manufacturing method in accordance with the present disclosure. In action 500E of FIG. 5E, the patterned first electrode layer 502 from the example light-emitting structure 500C of FIG. 5C may be positioned under a bank photomask 516 in action 500F of FIG. 5F, such that a material for forming a bank 510 may be patterned on the substrate 500 and surround the first electrode layer 502 as shown in the example light-emitting structure 500G of FIG. 5G. The cross-hatched pattern on the photomask 516 in FIG. 5F may prevent light transmission through the photomask 516 while the empty area (without the cross-hatched pattern) may allow light transmission through the photomask 516. FIG. 5H illustrates an example light-emitting structure 500H, which is a cross-sectional view of the example light-emitting structure 500G in FIG. 5G, fabricated by the actions 500E and 500F of the example manufacturing method in accordance with the present disclosure.

FIGS. 5I-5K illustrate a top view of one implementation of the example manufacturing method in accordance with the present disclosure. In action 500I of FIG. 5I, a first layered structure 504b may be disposed (e.g., deposited, coated, etc.) over the patterned bank 510 and the patterned first electrode layer 502 in the example light-emitting structure 500G of FIG. 5G. In action 500J of FIG. 5J, an emissive layer photomask 518 may be positioned above the disposed first layered structure 504b in action 500I such that a material for forming the emissive layer 504a may be patterned on the first layered structure 504*b* as shown in the example light-emitting structure 500K of FIG. 5K. The cross-hatched pattern on the photomask 518 in FIG. 5J may prevent light transmission through the photomask 518 while the empty area (without the cross-hatched pattern) may allow light transmission through the photomask 518. FIG. 5L illustrates an example light-emitting structure 500L, which is a cross-sectional view of the example light-emitting structure 500K in FIG. 5K, fabricated by the actions 500I and 500J of the example manufacturing method in accordance with the present disclosure. In one or more implementations, the emissive layer 504*a* may be patterned on the first layered structure 504*b* and above the first electrode layer 502 as shown in FIG. 5L. In one or more implementations, the first layered structure 504*b* may include at least one of a charge injection layer, a charge transport layer, and a charge blocking layer.

FIGS. 5M-5O illustrate a top view of one implementation of the example manufacturing method in accordance with the present disclosure. In action 500M of FIG. 5M, the patterned emissive layer 504*a* and the first layered structure 504*b* in example light-emitting structure 500K of FIG. 5K may be positioned under an insulating material photomask 520 in action 500N of FIG. 5N such that an insulating material 508 may be patterned over the first layered structure 504*b* as shown in the example light-emitting structure 500O in FIG. 5O. The cross-hatched pattern on the photomask 520 in FIG. 5N may prevent light transmission through the photomask 520 while the empty area (without the cross-hatched pattern) may allow light transmission through the photomask 520. FIG. 5P illustrates an example light-emitting structure 500P, which is a cross-sectional view of the example light-emitting structure 500O in FIG. 5O, fabricated by the actions 500M and 500N of the example manufacturing method in accordance with the present disclosure. In one or more implementations, the insulating material 508 may be patterned over the first layered structure 504*b* and may be patterned to surround and partially overlap the light emissive layer 504*a* as shown in the example light-emitting structure 500P. In one or more implementations, the thickness of the insulating material 508 over (overlap with) the light emissive layer 504*a* may be the same in thickness as the thickness of the light emissive layer 504*a*. In some implementations, the thickness of the insulating material 508 over (overlap with) the light emissive layer 504*a* may be slightly different in portions between the bank 510 and on top of the light emissive layer 504*a*.

FIGS. 5Q and 5R illustrate a top view of one implementation of the example manufacturing method in accordance with the present disclosure. In action 500Q of FIG. 5Q, a second layered structure 504*c* may be disposed (e.g., deposited, coated, etc.) over the patterned insulating material 508 and the patterned emissive layer 504*a* of the example light-emitting structure 500O in FIG. 5O, and a second electrode layer 506 may be disposed (e.g., deposited, coated, etc.) over the second layered structure 504*c*. In one or more implementations, the second layered structure 504*c* and the second electrode layer 506 may be disposed via deposition, coating, or the like, but are not limited to the example disposition techniques provided herein. For simplicity, other techniques are omitted for brevity. Further in action 500Q, a material for forming an auxiliary electrode layer 512 may be patterned over portions of the second electrode layer 506 such that the auxiliary electrode layer 512 may be patterned as shown in the example light-emitting structure 500R of FIG. 5R. The auxiliary electrode layer 512 may be patterned via photolithography techniques for electrode layers, thus example techniques for patterning electrode layers are not provided herein for brevity. FIG. 5S illustrates an example light-emitting structure 500S, which is a cross-sectional view of the example light-emitting structure 500R in FIG. 5R, fabricated by action 500Q of the example manufacturing method in accordance with the present disclosure. In one or more implementations, the second layered structure 504*c* may include at least one of a charge injection layer, a charge transport layer, and a charge blocking layer. In one or more implementations, the auxiliary electrode layer 512 may be patterned over portions of the second electrode layer 506 and the second layered structure 504*c* such that light emissions from the emissive layer 504*a* may transmit through the light-transmissive second layered structure 504*c* and second electrode layer 506.

Figure 6:
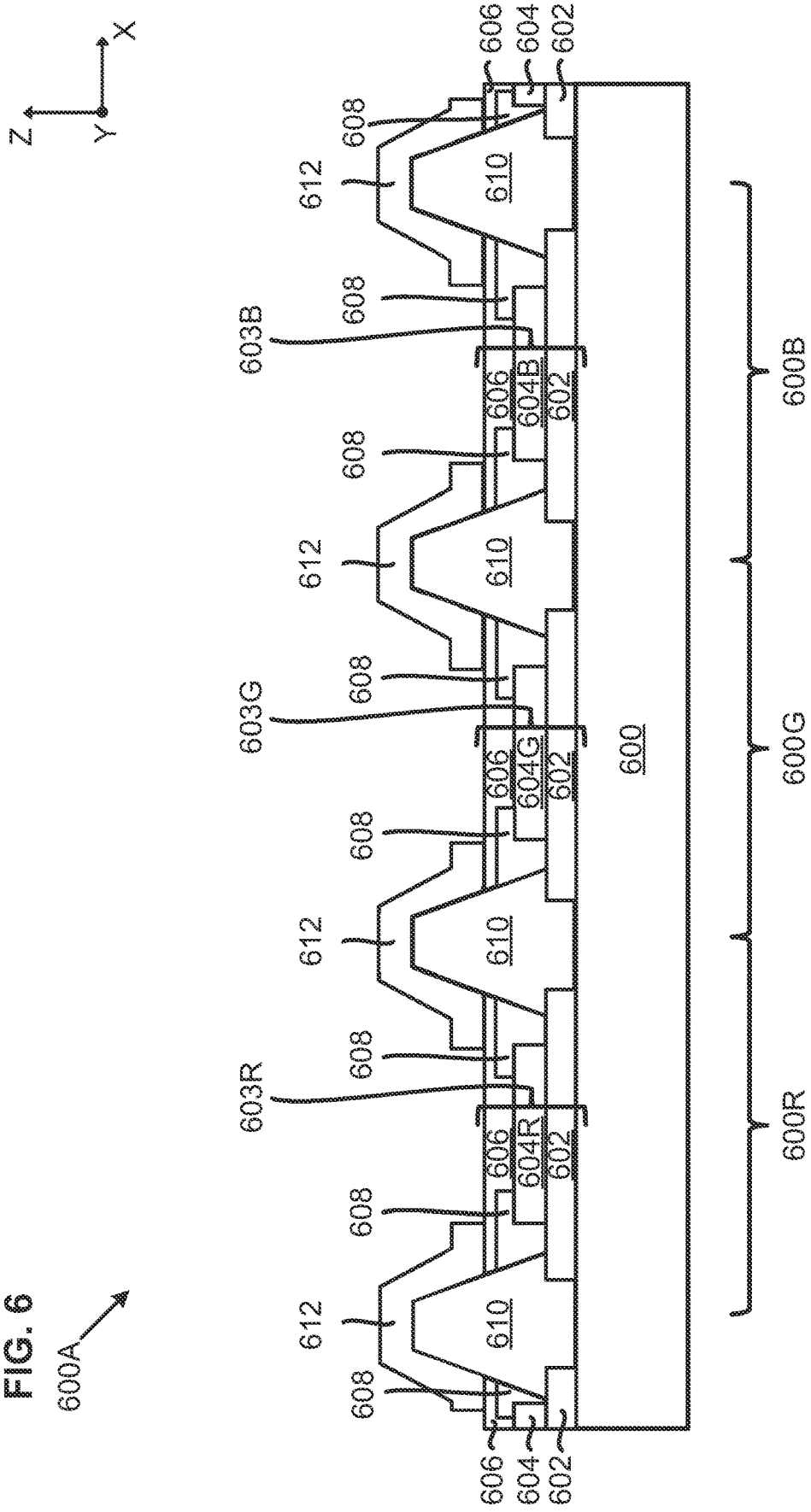
FIG. 6 is a schematic cross-sectional view illustrating an example light-emitting structure in accordance with an example implementation of the present disclosure.

FIG. 6 is schematic cross-sectional view illustrating at least three example sub-pixel stacks of an example light-emitting structure in accordance with an example implementation of the present disclosure.

In FIG. 6, an example light-emitting structure 600A may include a substrate 600 on which at least three light-emitting structures (e.g., 600R, 600G, 600B) are integrally formed (e.g., patterned, deposited, coated, etc.). Each of the light-emitting structures 600R, 600G, 600B may be similar to the light-emitting structure 200C in FIG. 2C and the light-emitting structure 300G in FIG. 3G with the exception where the example light-emitting structure 600A may include insulating materials overlapping with portions of emissive layers. The example light-emitting structures 600R, 600G, 600B may respectively include three sub-pixel stacks 603R, 603G, 603B. The example light-emitting structures 600R, 600G, 600B may further include an insulating material 608, a bank 610, and an auxiliary electrode layer 612. The three sub-pixel stacks 603R, 603G, 603B may each include an emissive stack (e.g., emissive stack 604R in sub-pixel stack 603R, emissive stack 604G in sub-pixel stack 603G, and emissive stack 604B in sub-pixel stack 603B) between a first electrode layer 602 and a second electrode layer 606. The emissive stacks 604R, 604G, 604B may be patterned and emit different colours. The insulating material 608 may be patterned to surround and overlap with at least a portion of each of the emissive stacks 604R, 604G, 604B. The bank 610 may be patterned to surround all of the sub-pixel stacks 603R, 603G, 603B and the insulating material 608. In one or more implementations, the thickness of each insulating material 608 over (overlap with) each emissive stack (604, 604R, 604G, 604B) may be the same in thickness as the thickness of each emissive stack (604, 604R, 604G, 604B). In some implementations, the thickness of each insulating material 608 over (overlap with) each emissive stack (604, 604R, 604G, 604B) may be slightly different in portions between the bank 610 and on top of each emissive stack (604, 604R, 604G, 604B). The auxiliary electrode layer 612 may be disposed (e.g., deposited to extend) over at least a portion of the second electrode layer 606 to improve conductivity while allowing light emissions from each of the emissive stacks 604R, 604G, 604B to transmit through the light-transmissive second electrode layer 606. In one or more implementations, the example light-emitting structure 600A may include an array of more than one sub-pixel stack (e.g., more than sub-pixel stacks 603R, 603G, 604B, etc.) emitting different colours and surrounded by the bank 610. In other implementations where emissive stacks (e.g., 604R, 604G, 604B) may emit different colours and include a first layered structure and a second layered structure (not explicitly shown), and each of the first layered structure and the second layered structure may include at least one of a charge injection layer, a charge transport layer, or a charge blocking layer, different charge transport layers may be applied for the emissive stacks emitting different colors to obtain maximum performance.

Figure 7A:
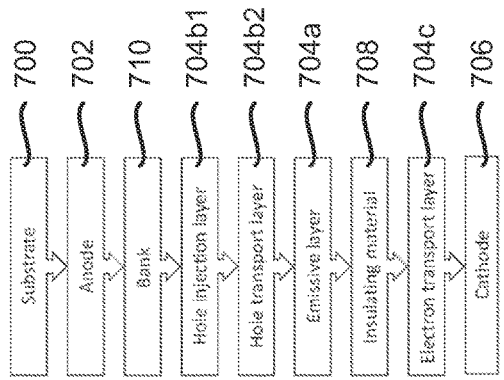
FIG. 7A is schematic flow diagram illustrating an example manufacturing method for a light-emitting structure in accordance with an example implementation of the present disclosure.
Figure 7B:
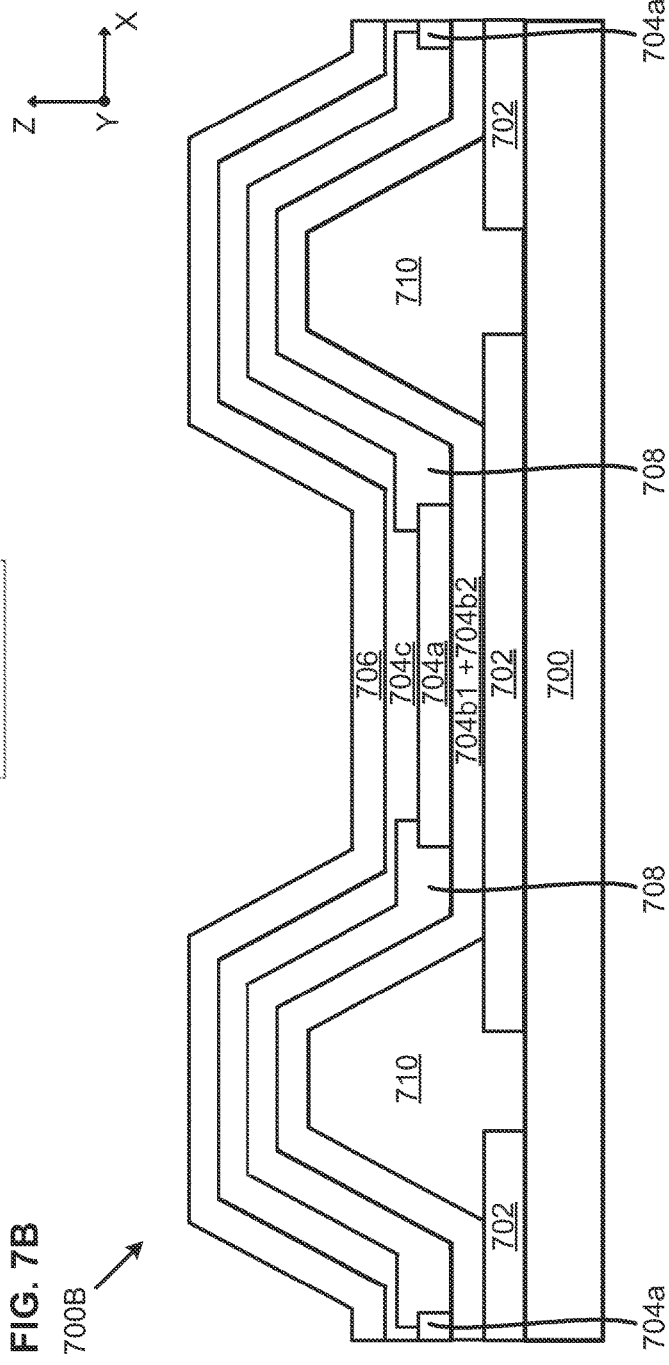
FIG. 7B is schematic cross-sectional view illustrating an example light-emitting structure fabricated by the example manufacturing method in FIG. 7A.

FIG. 7A is schematic flow diagram illustrating an example manufacturing method for a light-emitting structure in accordance with an example implementation of the present disclosure. FIG. 7B is schematic cross-sectional view illustrating an example light-emitting structure fabricated by the example manufacturing method in FIG. 7A.

In FIG. 7A, an example flow diagram 700A illustrates an example sequence for manufacturing layers of an example light-emitting structure in accordance with an example manufacturing method of the present disclosure. In example flow diagram 700A, a substrate may be provided, an anode 702 may be patterned on the substrate 700, a bank 710 may be patterned on the anode 702, a hole injection layer 704$b1$ may be disposed on the bank 710, a hole transport layer 704$b2$ may be disposed on the hole injection layer 704$b1$, an emissive layer 704$a$ may be patterned on hole transport layer 704$b2$, an insulating material 708 may be patterned on the emissive layer 704$a$, an electron transport layer 704$c$ may be disposed on the insulating material 708, and a cathode 706 may be disposed on the electron transport layer 704$c$.

In FIG. 7B, an example light-emitting structure 700B may be fabricated by the example manufacturing method in FIG. 7A. In the example light-emitting structure 700B, a substrate may be provided, an anode 702 may be patterned on the substrate 700, a bank 710 may be patterned on the anode 702, a hole injection layer 704$b1$ may be disposed on the bank 710, a hole transport layer 704$b2$ may be disposed on the hole injection layer 704$b1$, an emissive layer 704$a$ may be patterned on hole transport layer 704$b2$, an insulating material 708 may be patterned on the emissive layer 704$a$, an electron transport layer 704$c$ may be disposed on the insulating material 708, and a cathode 706 may be disposed on the electron transport layer 704$c$. In one or more implementations, the insulating material 708 may be patterned to not only surround the emissive layer 704$a$ but also patterned to overlap with at least a portion of the emissive layer 704$a$. In one or more implementations, the thickness of the insulating material 708 over (overlap with) the emissive layer 704$a$ may be the same in thickness as the thickness of the emissive layer 704$a$. In some implementations, the thickness of the insulating material 708 over (overlap with) the emissive layer 704$a$ may be slightly different in portions between the bank 710 and on top of the emissive layer 704$a$. In other implementations, the cathode 706 and the electron transport layer 704$c$ may be inverted in positions with the hole transport layer 704$b2$, the hole injection layer 704$b1$, and the anode 702 in another example light-emitting structure as an inverted light-emitting structure (not explicitly shown).

FIG. 8 is schematic flow diagram illustrating an example method of patterning layers of a light-emitting structure in accordance with an example implementation of the present disclosure. In FIG. 8, an example flow diagram 800 illustrates an example method of patterning some or all layers (e.g., electrodes, emissive layer, insulating material, bank, injection and/or transport layers, etc.) of a light-emitting structure through photolithography. In the example flow diagram 800, any of the layers, e.g., layer X, of a light-emitting structure may be deposited (e.g., spin-coated) on a substrate or a preceding layer. The deposited layer X (e.g., photoresist) may be exposed to patterned light (e.g., UV light) such that exposed and patterned portions of the layer X may undergo a chemical reaction allowing the patterned portions of the layer X to be soluble with suitable solution. The exposed and patterned portions of layer X may be developed (e.g., positive photoresist where the exposed and patterned portions of the layer X are soluble and are removed by a developing solution via chemical reaction, or negative photoresist where the unexposed portions of the layer X are soluble and are removed by the developing solution via chemical reaction) into a predetermined pattern. To discontinue the chemical reaction of the developing solution with the layer X, the patterned layer X along with the substrate/preceding layer are rinsed (e.g., with deionized (DI) water), and may be dried (e.g., spin dried). The rinsed and dried layer X with the predetermined pattern may be annealed (e.g., baked) to solidify the patterned layer X for a more durable patterned layer X. Each subsequent layer may be patterned via photolithography in according with the example flow diagram 800. In one or more implementations of the present disclosure, patterning of each layer and/or material as described in FIGS. 2A-2C, 3A-3G, 4, 5A-5S, 6, and 7B may be performed by photolithography in according with the example flow diagram 800. In other implementations, a range of solution processing techniques may also be applied to pattern the materials for OLED or QLED formation, such as ink-jet printing, "lift-off" processes, transfer printing, laser ablation, screen printing and micro-contact printing. The solution processing techniques to pattern the materials for forming OLEDs or QLEDs are not limited to the example techniques provided herein.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:
1. A light-emitting structure comprising:
    a substrate;
    a first electrode layer patterned on the substrate;
    a bank patterned to surround the first electrode layer;
    a first layered structure disposed over the first electrode layer and the bank;
    an emissive layer patterned on the first layered structure and above the first electrode layer;
    an insulating material patterned to surround the emissive layer and extend over the bank;
    a second layered structure disposed over the emissive layer and the insulating material; and
    a second electrode layer disposed over the second layered structure,
    wherein the first layered structure and the second layered structure each comprises at least one of a charge injection layer, a charge transport layer, or a charge blocking layer,
    wherein the second layered structure is in direct contact with and covers the emissive layer and the insulating material.

2. The light-emitting structure of claim 1, wherein the emissive layer comprises:
   at least one quantum dot (QD) emission material comprising a plurality of QDs.

3. The light-emitting structure of claim 1, wherein the emissive layer is patterned by UV-induced crosslinking.

4. The light-emitting structure of claim 1, wherein the insulating material is patterned by UV-induced crosslinking.

5. The light-emitting structure of claim 1, wherein the insulating material extends over at least a portion of the emissive layer.

6. The light-emitting structure of claim 1, further comprising:
   an auxiliary electrode layer deposited over at least a portion of the second electrode layer.

7. The light-emitting structure of claim 6, wherein the auxiliary electrode layer extends over the bank.

8. The light-emitting structure of claim 1, wherein a top surface of the bank is not covered by the second electrode layer.

* * * * *